(12) United States Patent
Fujita

(10) Patent No.: US 6,201,749 B1
(45) Date of Patent: Mar. 13, 2001

(54) SEMICONDUCTOR MEMORY

(75) Inventor: Mamoru Fujita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/598,335

(22) Filed: Jun. 21, 2000

(30) Foreign Application Priority Data

Jun. 24, 1999 (JP) ................................................. 11-179004

(51) Int. Cl.$^7$ ..................................................... G11C 7/00
(52) U.S. Cl. ......................... 365/203; 365/205; 365/207
(58) Field of Search ................................. 365/203, 205, 365/207, 208

(56) References Cited

U.S. PATENT DOCUMENTS 5,265,058 * 11/1993 Yamauchi ............................. 365/203
5,412,605 * 5/1995 Ooishi ................................. 365/203

* cited by examiner

*Primary Examiner*—Vu A. Le
(74) *Attorney, Agent, or Firm*—Scully, Scott, Murphy & Presser

(57) ABSTRACT

A semiconductor memory of the present invention includes a plurality of memory cell regions each being constituted by a particular memory cell and a plurality of word lines for selecting the memory cells. A word line driver circuit activates one word line to which a memory cell designated by the address signal is connected. A bit line connected to the memory cell selected by the activated word line reads data out of the memory cell. A sense amplifier amplifies a potential difference between two adjoining bit lines forming a bit line pair. A sense amplifier precharge circuit charges a power supply line and a ground line, which feed a voltage to the sense amplifier, to a preselected voltage. A driver circuit feeds to the gates of a first and a second n-channel MOS transistors in the sense amplifier precharge circuit a control signal of a preselected high level voltage from a third n-channel MOS transistor. The first and second n-channel MOS transistors feed a precharge current output from a precharge power supply to the power supply line and ground line, respectively. The sense amplifier precharge circuit may be replaced with or combined with an I/O line precharge circuit for precharging I/O lines.

23 Claims, 14 Drawing Sheets

SEMICONDUCTOR MEMORY

BACKGROUND OF THE INVENTION

The present invention relates to a semiconductor memory allowing precharging circuitry thereof to rapidly precharge sense amplifiers and I/O (Input/Output) lines for thereby implementing rapid data reading and writing.

It is a common practice with a DRAM (Dynamic Random Access Memory) or similar semiconductor memory to precharge bit line pairs connected to sense amplifiers and I/O lines before reading or writing data. The I/O lines are signal lines via which signals subjected to differential amplification are output from the sense amplifiers. Rapid precharging allows data to be rapidly written to or read out of memory cells.

Conventional semiconductor memories, however, have some problems left unsolved, as will be described specifically later with reference to the accompanying drawings.

SUMMARY OF THE INVENTION

It is therefore an object of the present invention to provide a semiconductor memory capable of reducing a precharging time without increasing a chip size and thereby realizing a short access time.

A semiconductor memory of the present invention includes a plurality of memory cell regions each being constituted by a particular memory cell and a plurality of word lines for selecting the memory cells. A word line drive circuit activates, based on an address signal input from outside the memory, one word line to which a memory cell designated by the address signal is connected. A bit line connected to the memory cell selected by the activated word line reads data out of the memory cell in the form of a voltage change. A sense amplifier amplifies a potential difference between two adjoining bit lines forming a bit line pair to thereby output two data voltages respectively corresponding to the two bit lines. A sense amplifier precharge circuit charges, before the sense amplifier starts amplifying the potential difference, a power supply line and a ground line, which feed a voltage to the sense amplifier, to a preselected voltage. A drive circuit feeds to the gates of a first and a second n-channel MOS Metal Oxide Semiconductor) transistor included in the sense amplifier precharge circuit a control signal of a preselected high-level voltage from a third n-channel MOS transistor. The first and second n-channel MOS transistors feed a precharge current output from a precharge power supply to the power supply line and ground line, respectively. The sense preamplifier precharge circuit may be replaced with or combined with an I/O (Input/Output) line precharge circuit for precharging I/O lines.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
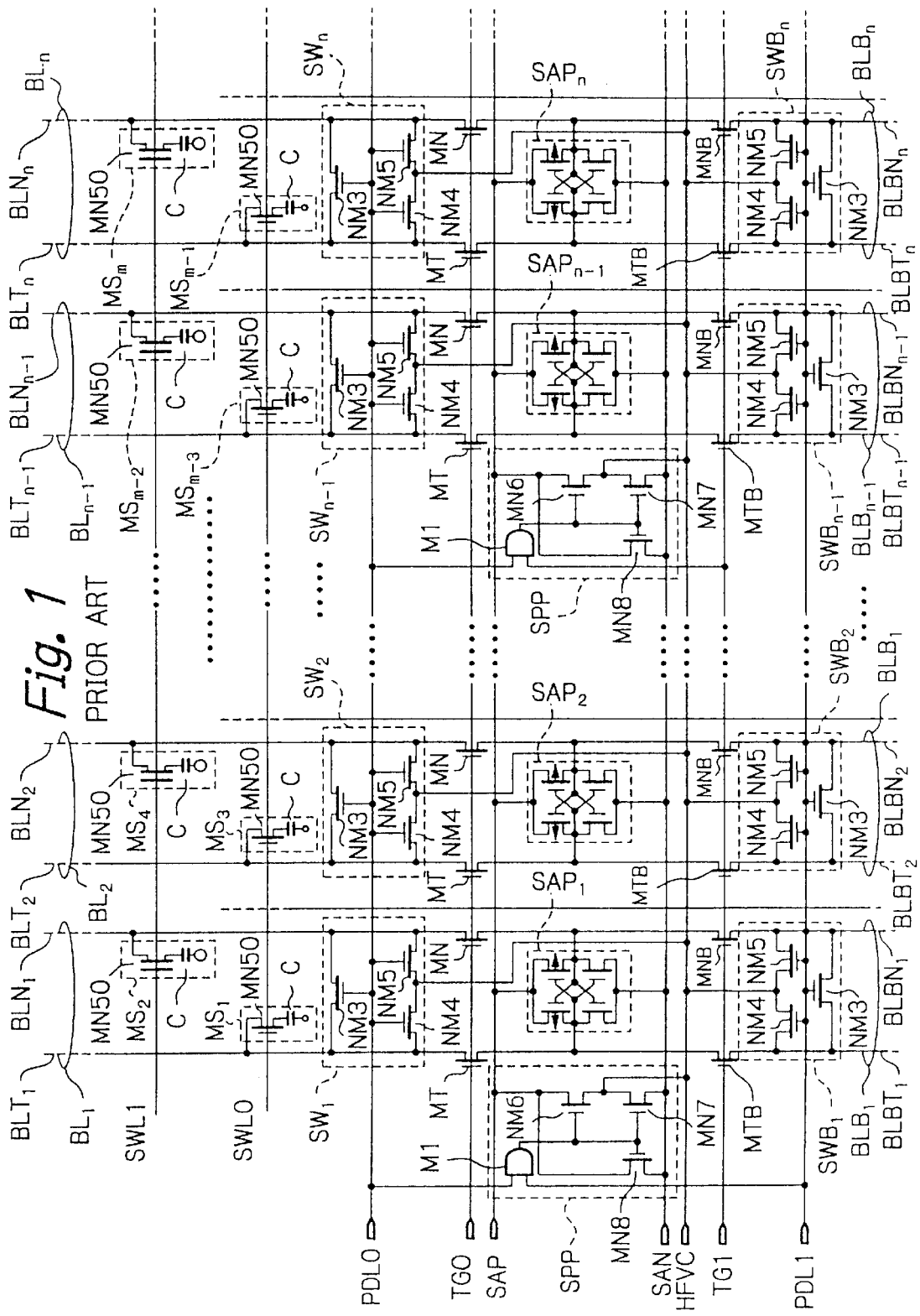
FIG. 1 is a block diagram schematically showing sense amplifier precharge circuitry included in a conventional semiconductor memory.
Figure 2:
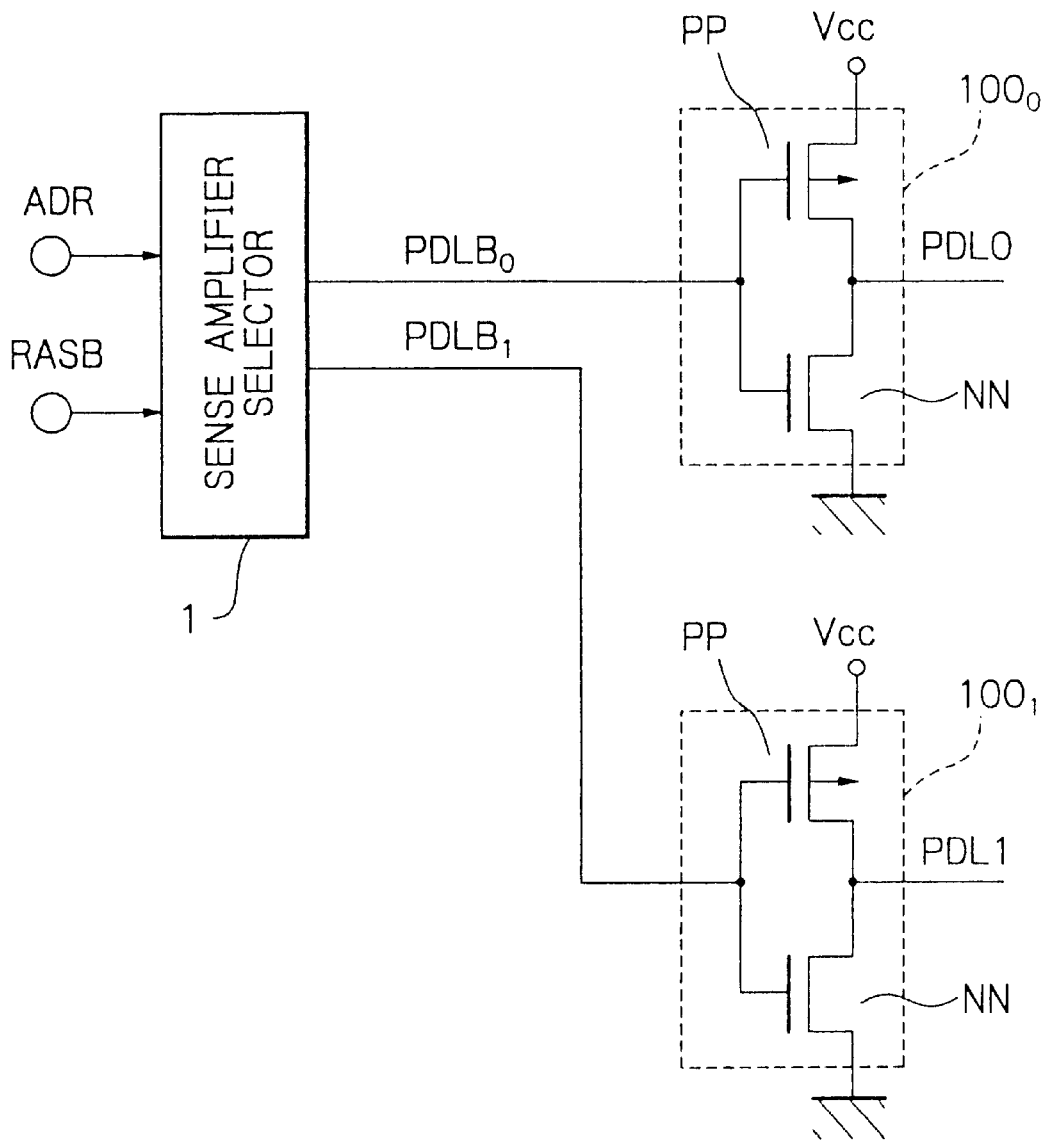
FIG. 2 is a block diagram schematically showing precharge drive circuits also included in the conventional semiconductor memory.

To better understand the present invention, reference will be made to shared sense amplifiers arranged in a conventional DRAM and circuitry around the sense amplifiers, shown in FIGS. 1 through 3. FIG. 1 shows sense amplifier precharge circuitry for precharging power supply lines SAP and SAN connected to sense amplifiers $SAP_1$ through $SAP_n$. FIG. 2 shows precharge drive circuits $100_0$ and $100_1$ together with an arrangement therearound.

As shown in FIGS. 1 and 2, the sense amplifiers $SAP_1$ through $SAP_n$ each are made up of p-channel and n-channel MOS (Metal Oxide Semiconductor) transistors arranged in a flip-flop configuration. Specifically, in each sense amplifier, upper two transistors are and lower two transistors are p-channel MOS transistors and n-channel MOS transistors, respectively. The sense amplifiers $SAP_1$ through $SAP_n$ each amplify a potential difference between a pair of bit lines connected thereto.

Specifically, a bit line $BLT_1$ and a bit line $BLN_1$ constitute a bit line pair $BL_1$. Likewise, bit lines $BLT_2$ through $BLT_n$ and bit lines $BLN_2$ through $BLN_n$ form bit line pairs $BL_2$ through $BL_n$, respectively. Further, bit lines $BLBT_1$ through $BLBT_n$ and bit lines $BLBN_1$ through bit lines $BLBN_n$ form bit line pairs $BLB_1$ through $BLB_n$.

The bit lines $BLT_1$ through $BLT_n$ are respectively connected to the sense amplifiers $SAP_1$ through $SAP_n$ via respective n-channel MOS transistors MT. Likewise, the bit lines $BLN_1$ through $BLN_n$ are respectively connected to the sense amplifiers $SAP_1$ through $SAP_n$ via respective n-channel MOS transistors MN. When a control signal TGO goes high, the MOS transistors MT and MN turn on and connect the bit line pairs $BL_1$ through $BL_n$ to the sense amplifiers $SAP_1$ through $SAP_n$, respectively.

Likewise, the bit lines $BLBT_1$ through $BLBT_n$ are respectively connected to the sense amplifiers $SAP_1$ through $SAP_n$ via respective n-channel MOS transistors MTB. The bit lines $BLBN_1$ through $BLBN_n$ are respectively connected to the sense amplifiers $SAP_1$ through $SAP_n$ via respective n-channel MOS transistors MNB. When a control signal TG1 goes high, the MOS transistors MTB and MNB turn on and connect the bit line pairs $BLB_1$ through $BLB_n$ to the sense amplifiers $SAP_1$ through $SAP_n$, respectively.

Figure 6:
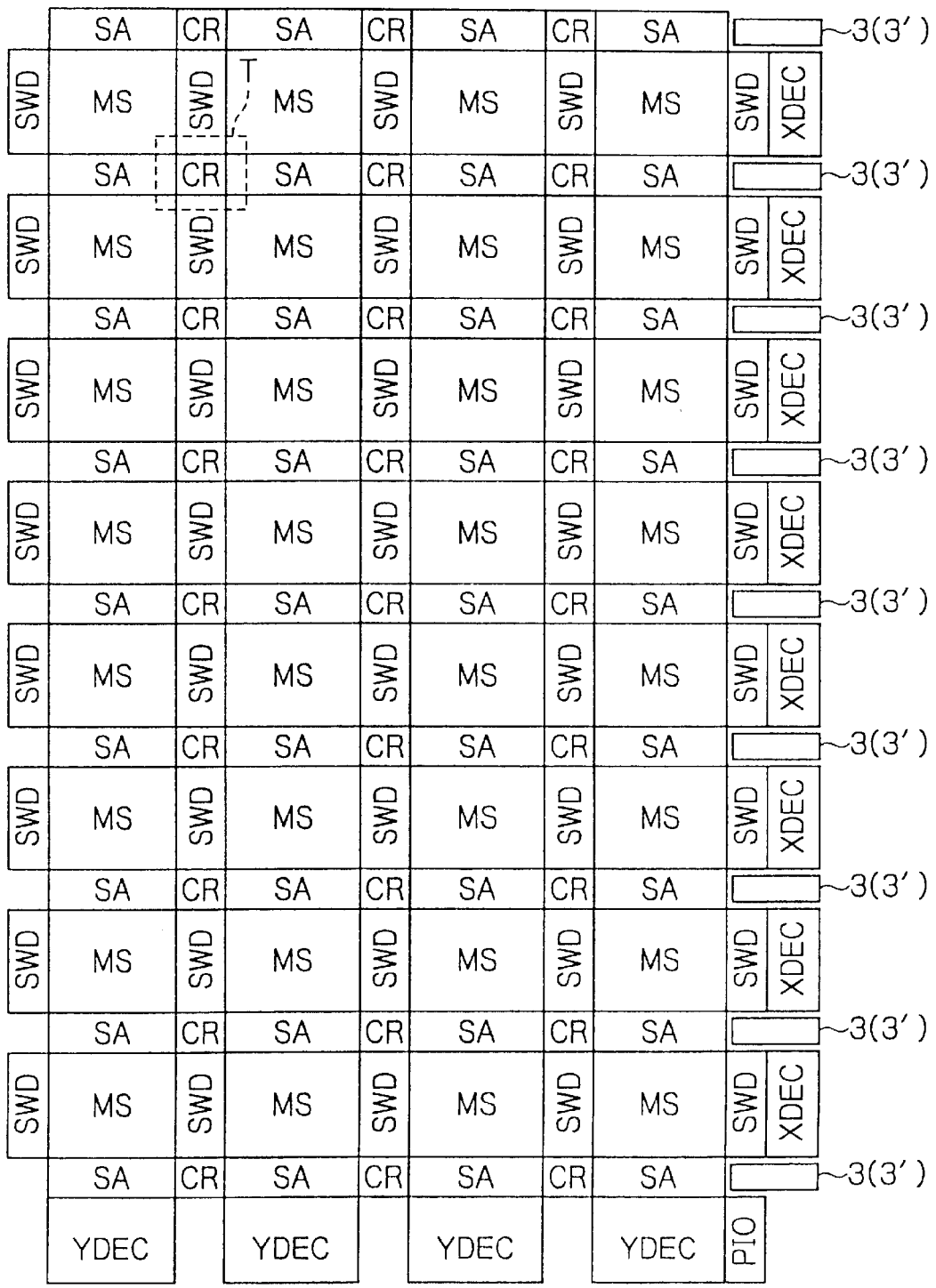
FIG. 6 is a schematic view showing the configuration of a shared sense type of DRAM.

A sense amplifier selector 1 is formed in a crossing region CR (see FIG. 6). The sense amplifier selector 1 selects, in response to a control signal RASB fed from outside the memory, a sense amplifier associated with a bit line pair to which a memory cell designated by an internal address signal ADR is connected. When no sense amplifiers are selected, the selector 1 maintains precharge control signals $PDLB_0$ and $PDLB_1$ in a low level. At this instant, the precharge drive circuits $100_0$ and $100_1$ respectively output precharge drive signals $PDL_0$ and $PDL_1$ in a low level. The precharge drive circuits $100_0$ and $100_1$ each are made up of a p-channel MOS transistor PP and an n-channel MOS transistor NN.

Precharge circuits $SW_1$ through $SW_n$ each are made up of n-channel MOS transistors. The precharge circuits $SW_1$ through $SW_n$ respectively precharge the bit lines forming the bit line pairs $BL_1$ through $BL_n$ in accordance with the control signal PDL0, thereby equalizing the bit lines of each bit line pair. Likewise, precharge circuits $SWB_1$ through $SWB_n$ each are made up of n-channel MOS transistors. The precharge circuits $SWB_1$ through $SWB_n$ respectively precharge the bit lines forming the bit line pairs $BLB_1$ through $BLB_n$ to a preselected voltage HFVC, e.g., Vcc/2 in accordance with the control signal PDL1 while equalizing the bit lines of each bit line pair; Vcc is the power supply voltage of the memory.

The power supply lines SAP and SAN connect a power supply to the sense amplifiers $SAP_1$ through $SAP_n$. Sense amplifier precharge circuits SPP precharge the power supply lines SAP and SAN to the voltage HFVC that may also be Vcc/2. The sense amplifier precharge circuits SPP each are made up of an AND gate $M_1$, an n-channel MOS transistor $NM_6$, an n-channel MOS transistor $NM_7$, and an n-channel MOS transistor $NM_8$. When the output of the AND gate $M_1$ goes high, the MOS transistors $MN_6$ and $MN_7$ turn on and respectively feed the voltage HFVC to the power supply lines SAP and SAN to thereby effect precharging. At the same time, the MOS transistor $MN_8$ turns on and equalizes the voltages on the power supply lines SAP and SAN (voltage HFVC).

Memory cells $MS_1$ through $MS_m$ (m being a natural number; 2×n=m) are connected to the bit lines $BLT_1$ through $BLT_n$ and $BLN_1$ through $BLN_n$ forming the bit lines pairs $BL_1$ through $BL_n$, as illustrated. Other memory cells are also connected to the bit lines $BLT_1$ through $BLT_n$ and $BLN_1$ through $BLN_n$ although not shown specifically. Likewise, memory cells, not shown, are connected to the bit lines $BLBT_1$ through $BLBT_n$ and $BLBN_1$ through $BLBN_n$ forming the bit line pairs $BLB_1$ through $BLB_n$. The memory cells $MS_1$ through $MS_m$ each have a capacitor C and an n-channel MOS transistor $NM_{50}$ and store data in the capacitor C in the form of a charge.

Figure 3:
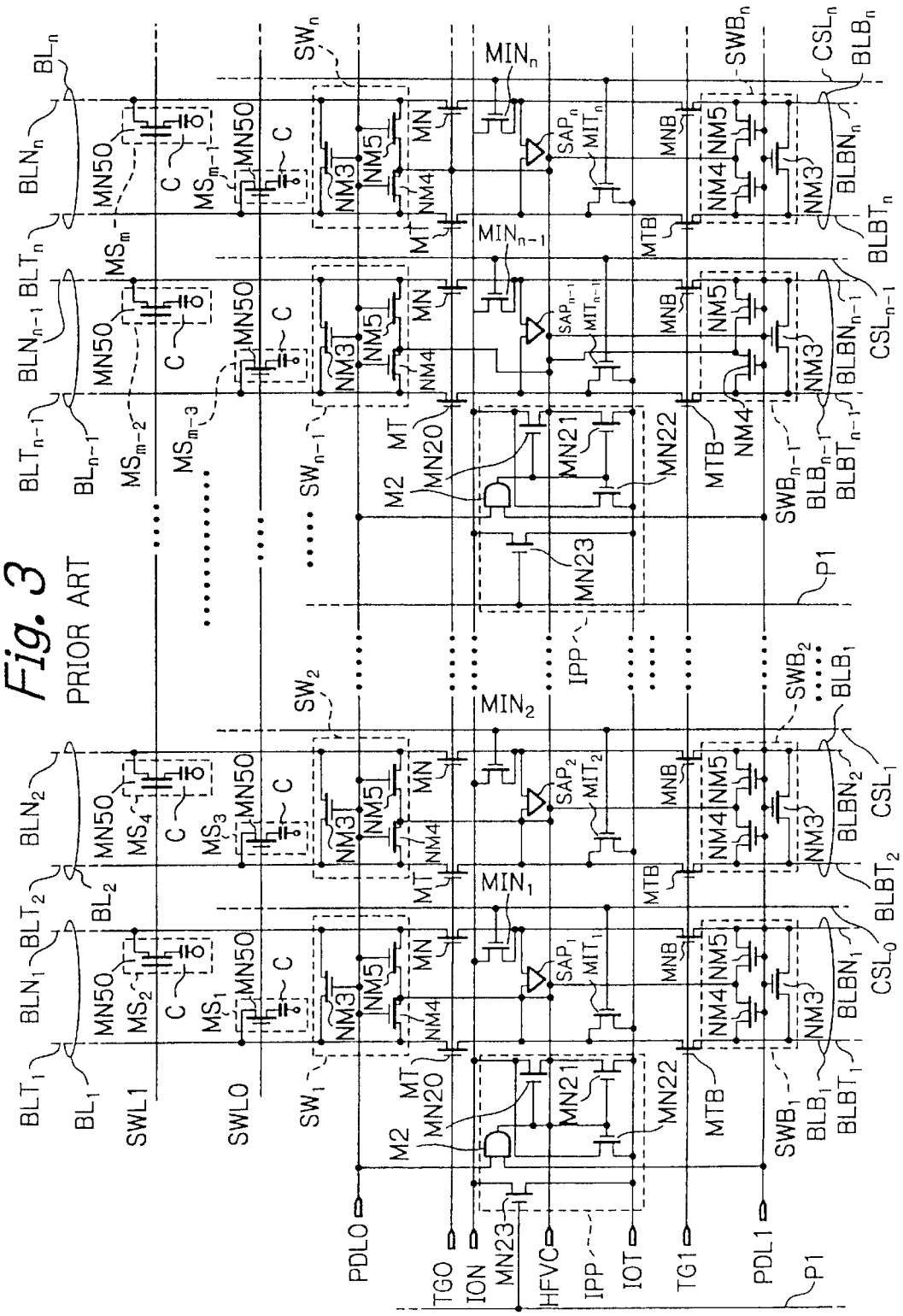
FIG. 3 is a schematic block diagram showing I/O line precharge circuitry included in the conventional semiconductor memory.

FIG. 3 shows conventional I/O (Input/Output) line precharge circuitry for precharging I/O lines IOT and ION. In FIG. 3, structural elements identical with the structural elements shown in FIGS. 1 and 2 are designated by identical reference numerals. As shown, the precharge drive signals $PDL_0$ and $PDL_1$, FIG. 2, are input to the circuitry in the same manner as in FIG. 1. I/O precharge circuits IPP precharge the I/O lines IOT and ION to the voltage HFVC of, e.g., Vcc/2. The I/O precharge circuits IPP each are made up of an AND gate M and n-channel MOS transistors $NM_{20}$, $NM_{21}$, and $NM_{22}$.

In each I/O precharge circuit IPP, when the output of the AND gate $M_2$ goes high, the MOS transistors $MN_{20}$ and $MN_{21}$ turn on and feed the voltage HFVC to the I/O lines IOT and ION to thereby effect precharging. At the same time, the MOS transistor $MN_{22}$ turns on to equalize the voltages on the I/O lines IOT and ION (voltage HFVC). Further, an n-channel MOS transistor $MN_{23}$ is connected between the I/O lines IOT and ION and ON/OFF controlled by a control signal PI. When the control signal PI is in a high level, the MOS transistor $MN_{23}$ equalizes the I/O lines IOT and ION. The control signal PI is generated on the basis of the column address by a circuit not shown.

The operation of the circuitry shown in FIGS. 1 and 2 will be described with reference to FIG. 4 on the assumption that data is read out of the memory cell $MS_1$. The control signals $PDL_0$ and $PDL_1$ remain in a high level and cause the sense amplifier precharge circuits SPP to precharge the power supply lines SAP and SAN. First, at a time $t_1$, a preselected row address (RAS) designating the memory cell $MS_1$ is input to the circuitry. In response, a row address decoder, not shown, outputs an internal address signal ADR. At the same time, a control signal RASB fed form outside the memory goes low. At this time, the bit line pairs $BL_1$ through $BL_n$ and $BLB_1$ through $BLB_n$, sense amplifiers $SAP_1$ through $SAP_n$ and I/O lines IOT and ION are precharged.

At a time $t_2$, the sense amplifier selector 1 delivers, based on the control signal RASB, the control signals $PDL_0$ and $PDL_1$ having a low level to the precharge drive circuits $100_0$ and $100_1$, respectively, located on the sense amplifier row corresponding to a preselected address decoder. In response, the precharge drive circuits $100_0$ and $100_1$ feeds the precharge signals $PDL_0$ and $PDL_1$ having a high level to the precharge circuits $SW_1$ through $SW_n$ and $SWB_1$ through $SWB_n$ respectively. Consequently, the precharge circuits $SW_1$ through $SW_n$, stop precharging the bit line pairs connected thereto while the precharge circuits $SWB_1$ through $SWB_n$ stop precharging the bit line pairs connected thereto.

In the above condition, the bit lines of the bit line pairs $BL_1$ through $BL_n$ and $BLB_1$ through $BLB_n$ become open, and so do the power supply lines SAP and SAN. The bit line pairs $BL_1$ through $BL_n$ and $BLB_1$ through $BLB_n$ and power supply lines SAP and SAN are charged to one half of the power supply voltage Vcc assigned to the memory, i.e., Vcc/2.

At a time $t_3$, a circuit, not shown, causes a control signal RAE, which generates a timing for activating word lines WD, to go high. An interval $t_{23}$ between the times $t_2$ and $t_3$ begins when the control signals $PDL_0$ and $PDL_1$ go low and ends when the precharging of the bit line pairs ends.

At a time $t_5$, a subword line decoder SWD (see FIG. 6) causes a word line $SWL_1$ to go high in accordance with the control signal RAE in order to turn on the MOS transistor $MN_{50}$. This allows a charge stored in the capacitor C of the memory cell $MS_1$ to be transferred to the bit line $BLT_1$.

At a time $t_6$, because the word line $SWL_1$ has gone high, the voltage on the bit line $BLT_1$ is raised from the precharged voltage HFVC by a voltage corresponding to the charge fed from the capacitor C. On the other hand, the voltage on the bit line $BLN_1$ is not raised because a word line $SWL_2$ is in a low level, i.e., because a charge is not fed from a memory cell $MS_2$ connected to the word line $SWL_2$. More specifically, assuming that high-level data is stored in the memory cell $MS_1$, then the charge stored in the capacitor C of the memory cell $MS_1$ is transferred to the bit line $BLT_1$ and causes the voltage on the bit line $BLT_1$ to rise above the precharge voltage Vcc/2. However, the voltage on the bit line, or dummy line, $BLN_1$ remains at Vcc/2.

At a time $t_7$, the voltage of the capacitor C and the voltage of the bit line $BLT_1$ are equilibrated due to the charge transfer from the capacitor C of the memory cell $MS_1$ to the bit line $BLT_1$. At this instant, a circuit, not shown, causes a control signal SE1 to go high. In response, a power supply circuit, not shown, feeds the voltage Vcc to the power supply line SAP and feeds ground potential to the power supply line SAN, thereby activating the sense amplifiers $SAP_1$ through $SAP_n$.

At a time $t_8$, a circuit, not shown, causes the control signal TGO to go high in order to select the upper bit lines $BLT_1$ through $BLT_n$ and $BLN_1$ through $BLN_n$, to which the memory cells $MS_1$ through $MS_m$ are connected, in accordance with an address signal. As a result, the MOS transistors MT and MN are turned on to connect the bit lines $BLT_1$ and $BLN_1$ to the sense amplifier $SAP_1$. At the same time, the bit lines $BLT_2$ through $BLT_n$ and $BLN_2$ through $BLN_n$ are respectively connected to the sense amplifiers $SAP_2$ through $SAP_n$. Consequently, a voltage difference between the bit lines $BLT_1$ through $BLN_1$ is amplified due to the voltage Vcc and ground potential respectively applied to the power supply lines SAP and SAN.

The sense amplifier $SAP_1$ delivers the amplified potential difference between the bit lines $BLT_1$ and $BLN_1$ to an output driver, not shown, in the form of high-level data via a column switch, not shown, and a data amplifier, not shown, in accordance with a column address fed from outside the memory.

At a time $t_{12}$, the control signal RASB goes high. Then, at a time $t_{13}$, the control signal RAE goes low in order to cause the word line $SWL_1$ to go low. Subsequently, at a time $t_{15}$, the subword line decoder SWD causes the word line $SWL_1$ to go low because the control signal RAE has gone low. Consequently, the memory cell $MS_1$ and the memory cells connected to the word line $SWL_1$ are disconnected from the bit line $BLT_1$ and the other bit lines, respectively, and become open. Likewise, the control signal TGO goes low to turn off the MOS transistors MT and MN. As a result, the bit lines $BLT_1$ through $BLT_n$ and $BLN_1$ through $BLN_n$ are disconnected from the sense amplifiers $SAP_1$ through $SAP_n$, respectively, and become open.

At a time $t_{18}$, the control signal $SE_1$ is caused to go low because the word line $SWL_1$ is in a low level and because the memory cell $MS_1$ is disconnected from the bit line BLT1. As a result, the power supply lines SAP and SAN are disconnected from the power supply circuit and become open.

At a time $t_{19}$, the sense amplifier selector 1 causes the precharge control signals $PDLB_0$ and $PDLB_1$ to go low because the power supply lines SAP and SAN are open. In response, the precharge drive circuits $100_0$ and $100_1$ respectively cause the charge signals $PDL_0$ and $PDL_1$ to go high. The precharge signals $PDL_0$ and $PDL_1$ in a high level are delivered to the precharge circuits $SW_1$ through $SW_n$ and precharge circuits $SWB_1$ through $SWB_n$, respectively. Consequently, the precharge circuits $SW_1$ through $SW_n$ each start precharging the bit line pair connected thereto. Likewise, the sense amplifier precharge circuit SPP start precharging the power supply lines SAP and SAN connected thereto.

At a time $t_{23}$, the sense amplifier precharge circuit SPP precharges the power supply lines SAP and SAN to the HFVC (precharge voltage Vcc/2). Then, at a time $t_{25}$, the precharge circuits $SW_1$ through $SW_n$ respectively precharge the bit lines forming the bit line pairs $BLB_1$ through $BLB_n$ to the voltage HFVC while equalizing them, as stated earlier. This is the end of the precharging procedure.

The operation of the circuitry shown in FIG. 3 will be described with reference to FIG. 5. Again, assume that data is read out of the memory cell $MS_1$. Because the control signals $PDL_0$ and $PDL_1$ are in a high level, the I/O line precharge circuit IPP precharges the power supply lines SAP and SAN. A sequence of steps to be effected at times $t_1$, $t_2$ and $t_4$ through $t_8$ in FIG. 5, as well as the precharging of the bit line pairs, are identical with the steps described with reference to FIG. 4 and will not be described specifically in order to avoid redundancy. In this case, the control signals $PDL_0$ and $PDL_1$ input to the I/O precharge circuit IPP both are in a high level, causing circuit IPP to precharge the I/O lines IOT and ION.

Figure 5:
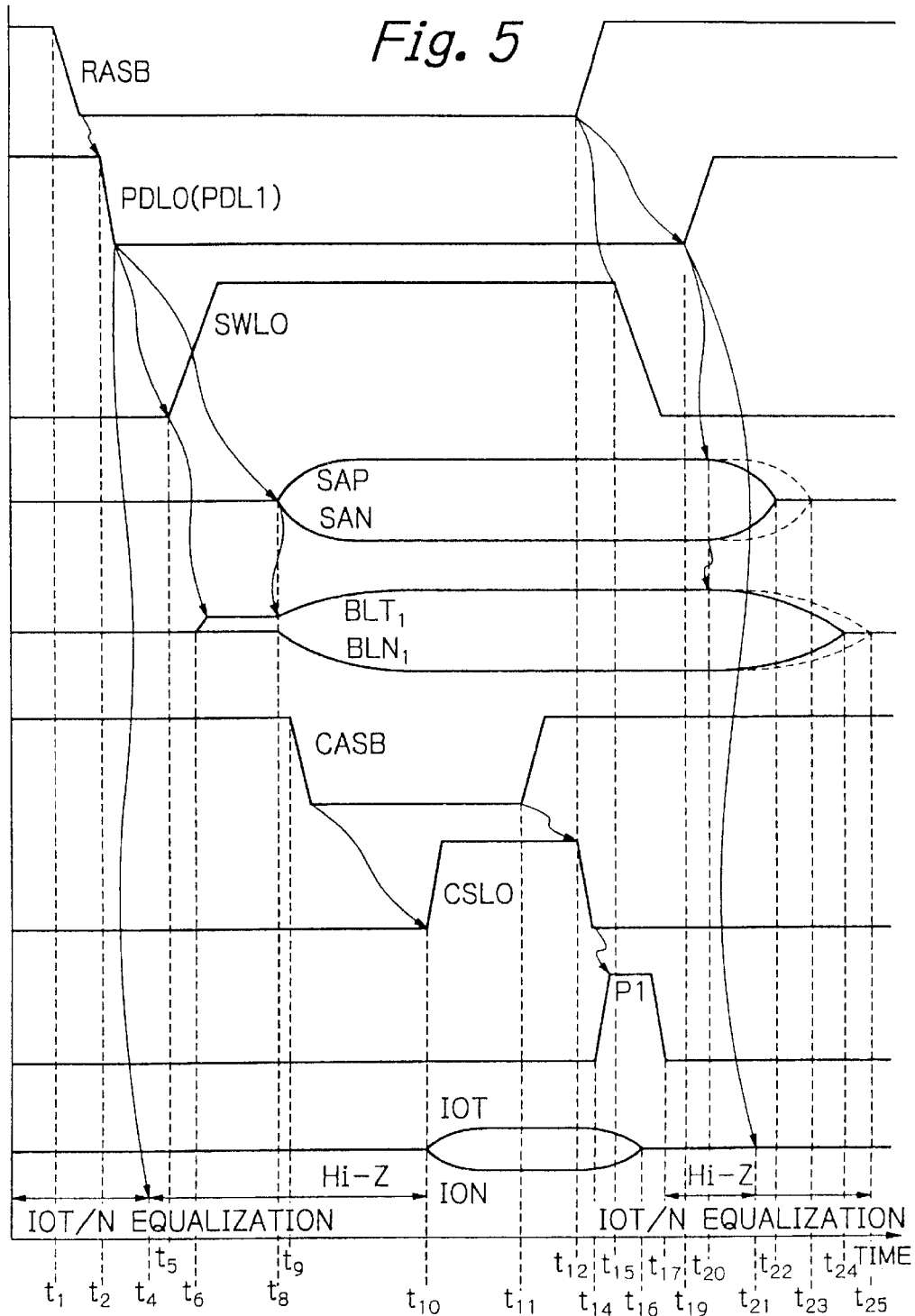
FIG. 5 is a timing chart representative of another specific operation of the conventional semiconductor memory.

As shown in FIG. 5, at a time $t_4$, the I/O line precharge circuit IPP stops precharging the I/O lines IOT and ION because the control signals $PDL_0$ and $PDL_1$ have gone low the time $t_2$. At this time, the precharge voltage HFVC is appearing on the I/O lines IOT and ION. The I/O lines IOT and ION are open, i.e., held in a high impedance (Hi-Z) state.

At a time $t_9$, a control signal CASB input from outside the memory goes low. Then, at a time $t_{10}$, a column decoder, not shown, causes a control signal $CSL_1$ to go high in accordance with a column address signal input when the control signal CASB has gone low, i.e., corresponding to the memory cell $MS_1$. Consequently, MOS transistors $MIT_1$ and $MIN_1$ are turned on to deliver the voltages on the bit lines $BLT_1$ and $BLN_1$ to the I/O lines IOT and ION, respectively. If high-level data is stored in the memory cell $MS_1$, the high-level data is output to the output driver via the column switch and data amplifier in accordance with a column address fed from outside the memory.

At a time $t_{11}$, the control signal CASB goes high. In response, at a time $t_{12}$, the column decoder causes the control signal $CSL_1$ to go low. Then, at a time $t_{14}$, the control signal $CSL_1$ fully falls to a low level and turns off the MOS transistors $MIT_1$ and $MIN_1$. The bit lines $BLT_1$ and $BLN_1$ are therefore disconnected from the I/O lines IOT and ION, respectively. A circuit, not shown, causes a control signal IPI to go high. As a result, a MOS transistor $MN_{22}$ is turned on to short-circuit the I/O lines IOT and ION for thereby equalizing them.

At a time $t_{16}$, the I/O lines IOT and ION are substantially equilibrated at Vcc/2 due to the above equalization, i.e., precharged.

At a time $t_{17}$, a circuit, not shown, causes a control signal PIO to go low with the result that the I/O lines IOT and ION become open (high impedance (Hi-Z) state). At a time $t_{19}$, the sense amplifier selector, not shown, causes the control signals $PDL_0$ and $PDL_1$ to go high in accordance with the control signal RASB because the control signal $CSL_1$ has gone low at the time $t_{12}$. Consequently, at a time $t_{21}$, the I/O line precharge circuit IPP starts precharging the I/O lines IOT and ION. The procedure to follow is identical with the procedure described with reference to FIG. 4 and will not be described specifically.

Figure 4:
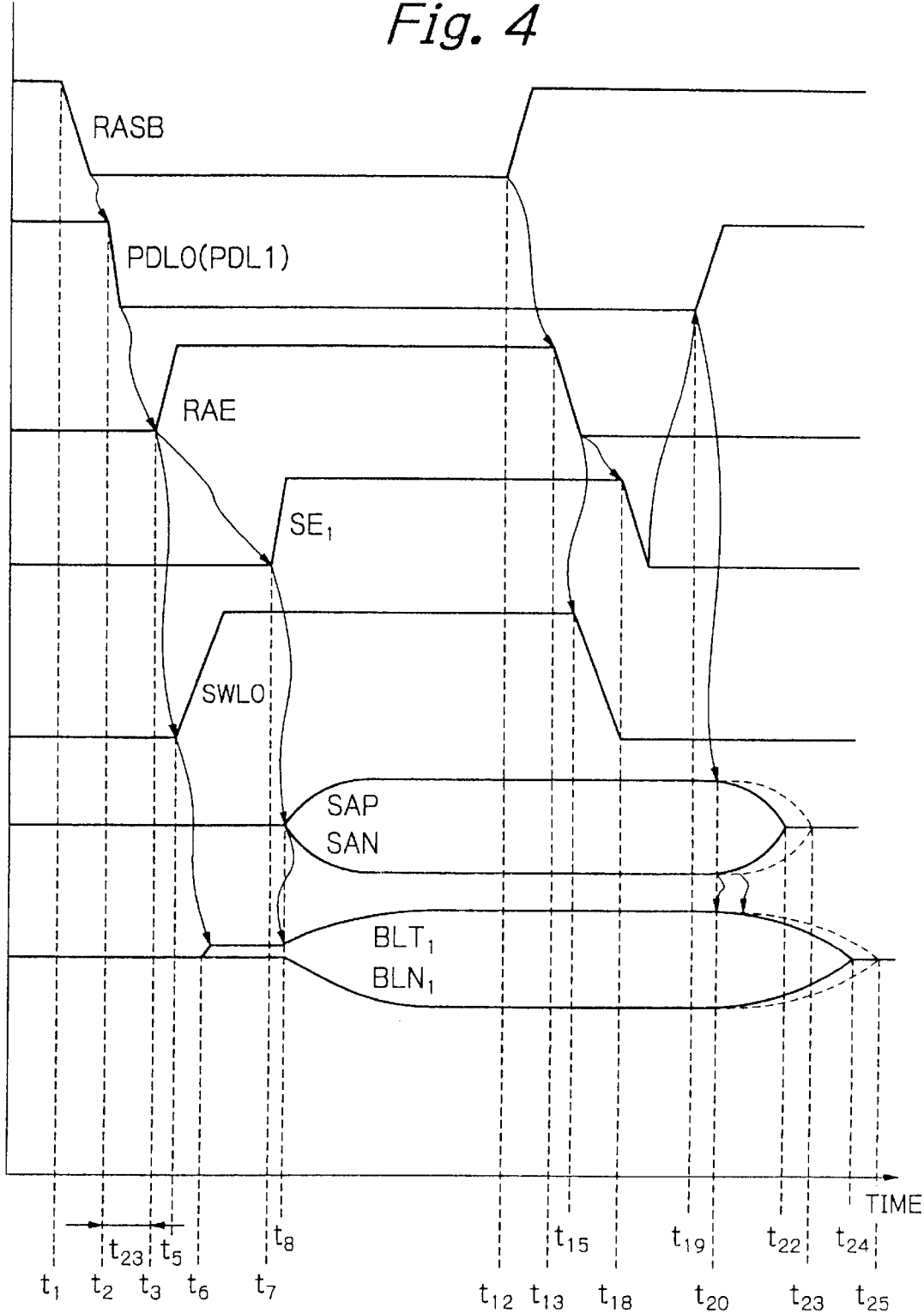
FIG. 4 is a timing chart demonstrating a specific operation of the conventional semiconductor memory.

As described above, by reducing the interval between the times $t_3$ and $t_{15}$ shown in FIG. 4 and allocated to the precharging of the sense amplifiers $SAP_1$ through $SAP_n$, it is possible to reduce the waiting time up to the read-out of data and therefore to enhance rapid read-out. For this purpose, the transition time of the MOS transistors of the sense amplifier precharge circuit SPP from the OFF state to the ON state may be reduced. Alternatively, the charge current assigned to the above MOS transistors may be increased.

More specifically, the channel length of the MOS transistors arranged in the sense amplifier precharge circuit SPP is determined by some different factors including voltage. In light of this, the width of the MOS transistors may be increased, or channel conductance in the ON state of the MOS transistors may be improved.

Also, by reducing the precharging time assigned to the I/O lines IOT and ION and beginning at the time $t_{21}$ shown in FIG. 5, it is possible to reduce the waiting time and therefore to enhance rapid read-out. For this purpose, the transition time of the MOS transistors of the I/O line precharge circuit IPP from the OFF state to the ON state may be reduced. Alternatively, the charge current assigned to the above MOS transistors may be increased. More specifically, because the channel length of the MOS transistors arranged in the precharge circuit IPP is determined by some different factors including voltage, the width of the MOS transistors may be increased, or channel conductance in the ON state of the MOS transistors may be increased.

However, an increase in the channel width of the MOS transistors directly translates into an increase in the area that the sense amplifier precharge circuit SPP or the I/O line precharge circuit IPP occupies. Specifically, as shown in FIG. 6, the precharge circuits SPP or IPP are formed at crossing regions CR where regions SA accommodating the sense amplifiers $SAP_1$ through $SAP_n$ and word line decoders SWD for controlling the word lines cross each other.

The precharge circuits SPP or IPP therefore increase the areas of the crossing regions CR, i.e., the boundary regions between the limited memory cell regions $M_S$ and therefore the overall chip area. The precharge drive circuits $100_0$ and $100_1$ assigned to the precharge circuits $SW_1$ through $SW_n$ and precharge circuits $SWB_1$ through $SWB_n$, respectively, are also formed in the crossing regions CR. Moreover, the precharge drive circuits $100_0$ and $100_1$ are implemented by n-channel and p-channel MOS transistors. FIG. 6 schematically shows the configuration of a shared sense type of DRAM.

An alternative implementation is to reduce a period of time necessary for the potential of the above MOS transistors to rise, i.e., the turn-on time of the MOS transistors or to increase the gate voltage of the MOS transistors for thereby improving channel conductance. This is successful to enhance the driving ability of the MOS transistors constituting the precharge circuits SPP or IPP. However, this alternative implementation brings about other problems, as will be described hereinafter.

In the sense amplifier precharge circuit SPP, the AND gate $M_1$ for driving the MOS transistors $MN_6$ and $MN_7$ is implemented by CMOS (complementary MOS) transistors including a p-channel MOS transistor. Because the AND gate $M_1$ ON/OFF controls the MOS transistors $MN_6$ and $MN_7$, the turn-on time and turn-off time of the transistors $MN_6$ and $MN_7$ are determined by the driving ability.

Likewise, in the I/O line precharge circuit IPP, the AND gate $M_2$ for driving the MOS transistors $MN_{20}$ and $MN_{21}$ is implemented by CMOS transistors also including a p-channel MOS transistor. Because the AND gate $M_2$ ON/OFF controls the MOS transistors $MN_{20}$ and $MN_{21}$, the turn-on time and turn-off time of the transistors $MN_{20}$ and $MN_{21}$ are determined by the driving ability.

Further, the precharge circuits SPP or IPP each are formed in a particular crossing region CR, FIG. 6, as stated earlier. Therefore, when the channel width of the MOS transistors constituting the AND gate $M_1$ is increased in order to reduce the turn-on time and turn-off time of the MOS transistors $MN_6$ and $MN_7$, the crossing region CR must be increased in area. This is also true with the channel width of the MOS transistors constituting the AND gate $M_2$.

Figure 7:
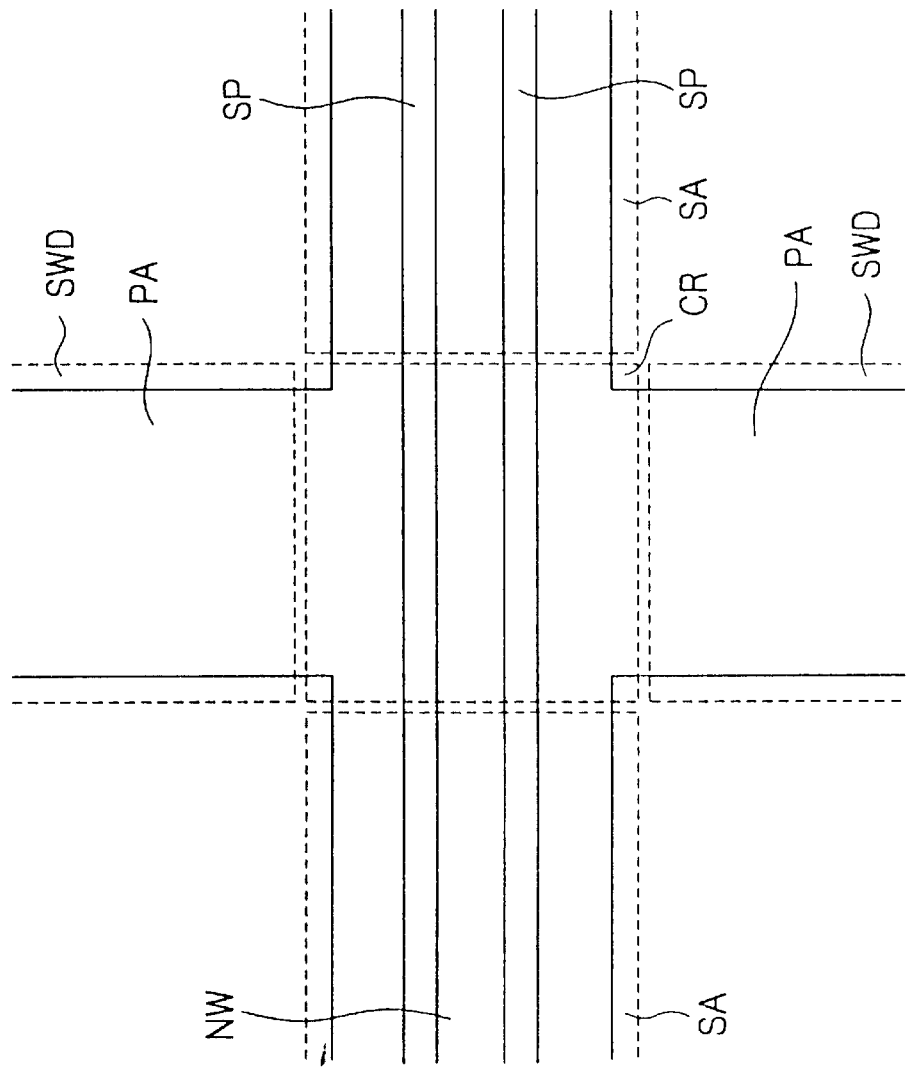
FIG. 7 is an enlarged fragmentary view of a crossing region included in the configuration of FIG. 6.

FIG. 7 is a fragmentary enlarged view of a portion T shown in FIG. 6. As shown, the p-channel MOS transistors of the AND gate $M_1$ or $M_2$ can be formed only in an n-well region NW included in the crossing region CR. Labeled PA in FIG. 7 is a region allocated to the n-channel MOS transistors (p-substrate or p-well). Separating regions SP separate the n-well region NW and regions for forming the n-channel MOS transistors. In this configuration, as the turn-on time of the MOS transistors $MN_6$ and $MOS_7$ or that of the MOS transistors $MN_{20}$ and $MS_{21}$ is reduced, it becomes more difficult to increase the channel width of the p-channel MOS transistors of the AND gate $M_1$ or $M_2$.

Figure 8:
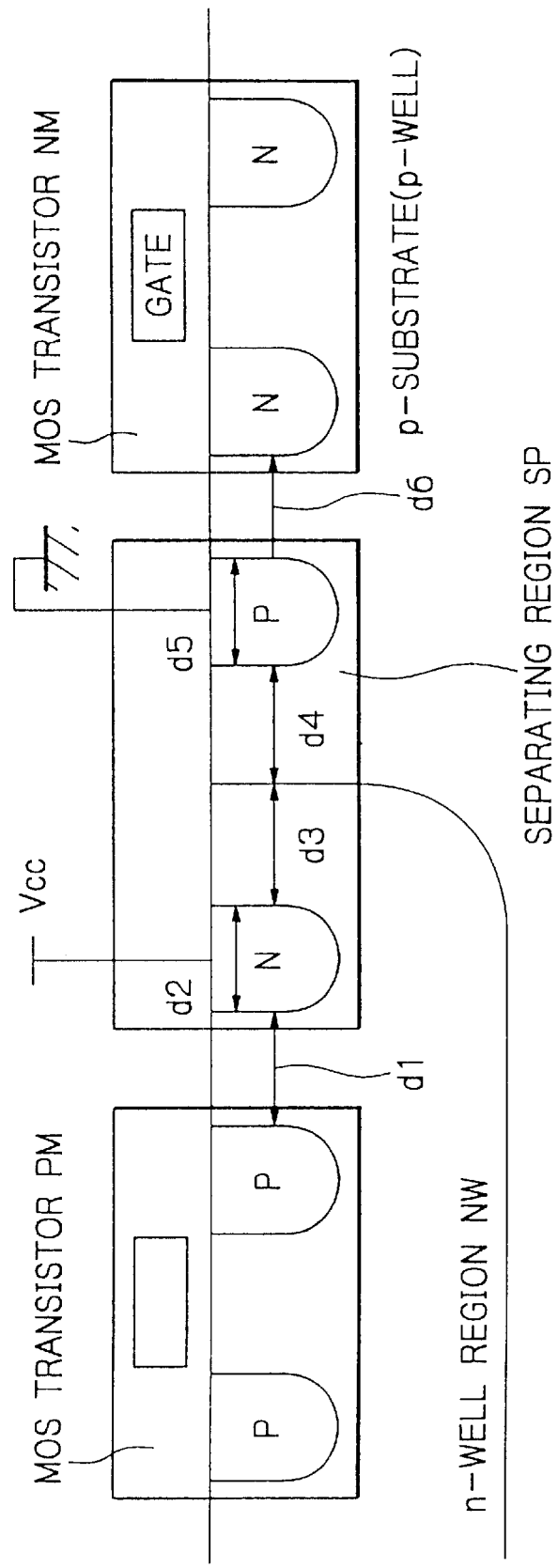
FIG. 8 is a section showing a structure around an n-well included in a semiconductor memory.

More specifically, the separating regions SP for stabilizing potential is essential with the n-well region allocated to the p-channel MOS transistors, limiting the area available for the n-well region to a noticeable degree in the crossing region CR. FIG. 8 shows specifically a distance $d_1$ between the diffusion layer of a MOS transistor PM and the n-type diffusion layer of a separating region SP having a width $d_2$, a distance $d_3$ between the n-type diffusion layer of the separating region SP and the edge of an n-well, a distance $d_3$ between the edge of the n-well and the p-type diffusion layer of the separating region SP having a width $d_5$, and a distance between the p-type diffusion layer of the separating region SP and the diffusion layer of an n-channel MOS transistor NM. The distances $d_1$, $d_3$, $d_4$ and $d_6$ and widths $d_2$ and $d_5$ each are determined beforehand in accordance with a layout design rule.

It follows that the channel width of the p-channel MOS transistor in the crossing region CR cannot be increased without increasing the area of the n-well region NW in the same region CR. The conventional semiconductor memory therefore has a problem that an increase in the channel width of the p-channel MOS transistor directly translates into an increase in the overall area of the chip. This problem also arises when the channel width of the MOS transistors $MN_6$ and $MN_7$ or that of the MOS transistors $MN_{20}$ and $MN_{21}$ is increased in order to increase the precharge current for the sense amplifiers $SAP_1$ through $SAP_n$ or for the I/O lines IOT and ION.

Moreover, assume that the conductance of the p-channel MOS transistor of the AND gate $M_1$ or $M_2$ and therefore the drive current is increased in order to reduce the turn-on time of the MOS transistors $MN_6$ and $MN_7$ or that of the MOS transistors $MN_{20}$ and $MN_{21}$. Then, a negative voltage must be applied to the gate of the p-channel MOS transistor. At this instant, an arrangement for applying the negative voltage must be confined in the crossing region CR so as to prevent a forward current from flowing into a semiconductor substrate. This is also true with the precharge drive circuits $100_0$ and $100_1$ and increases the area to be allocated to the crossing region CR and therefore the overall area of the chip.

Figure 9:
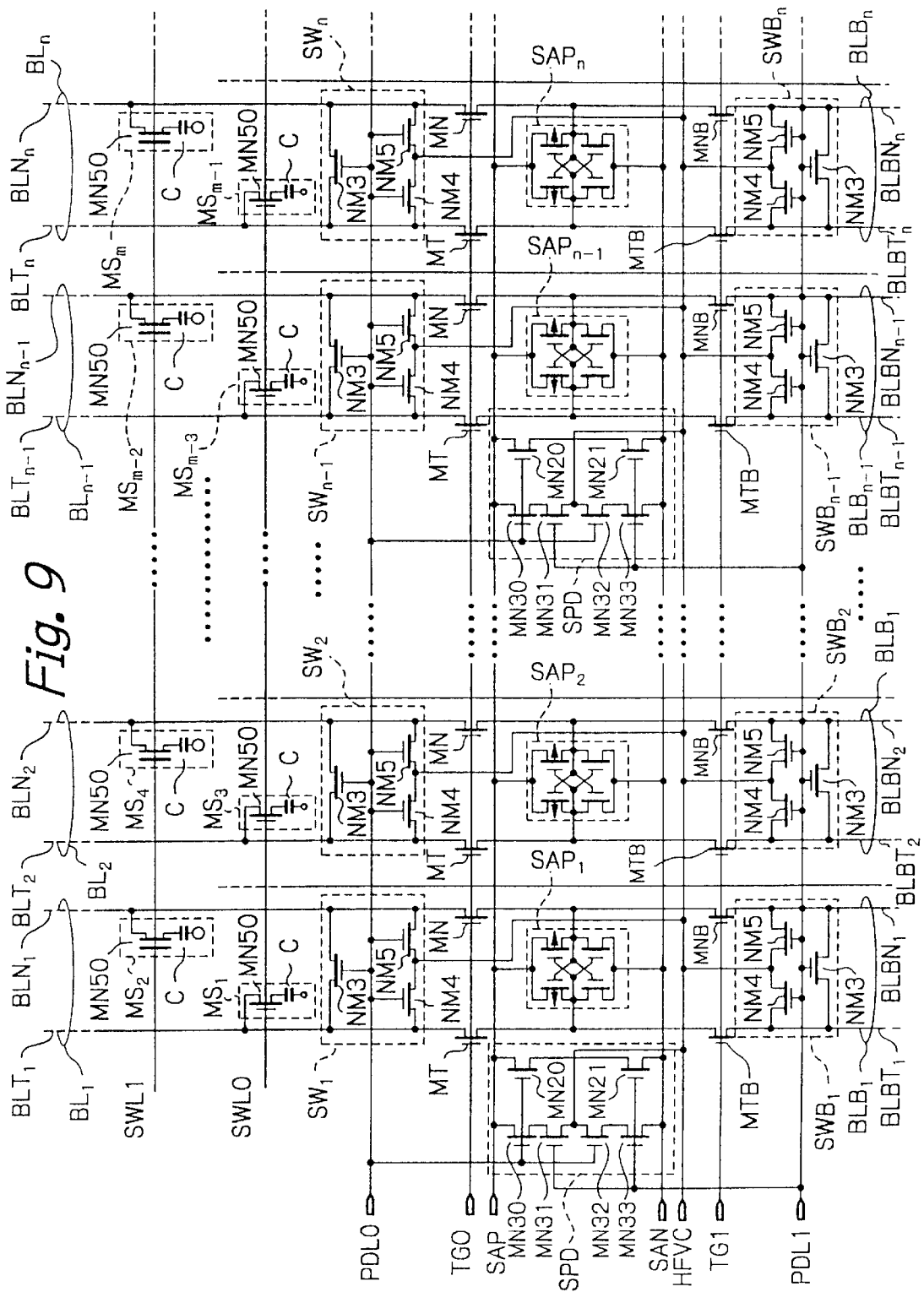
FIG. 9 is a schematic block diagram showing sense amplifier precharge circuitry included in a semiconductor memory embodying the present invention.
Figure 10:
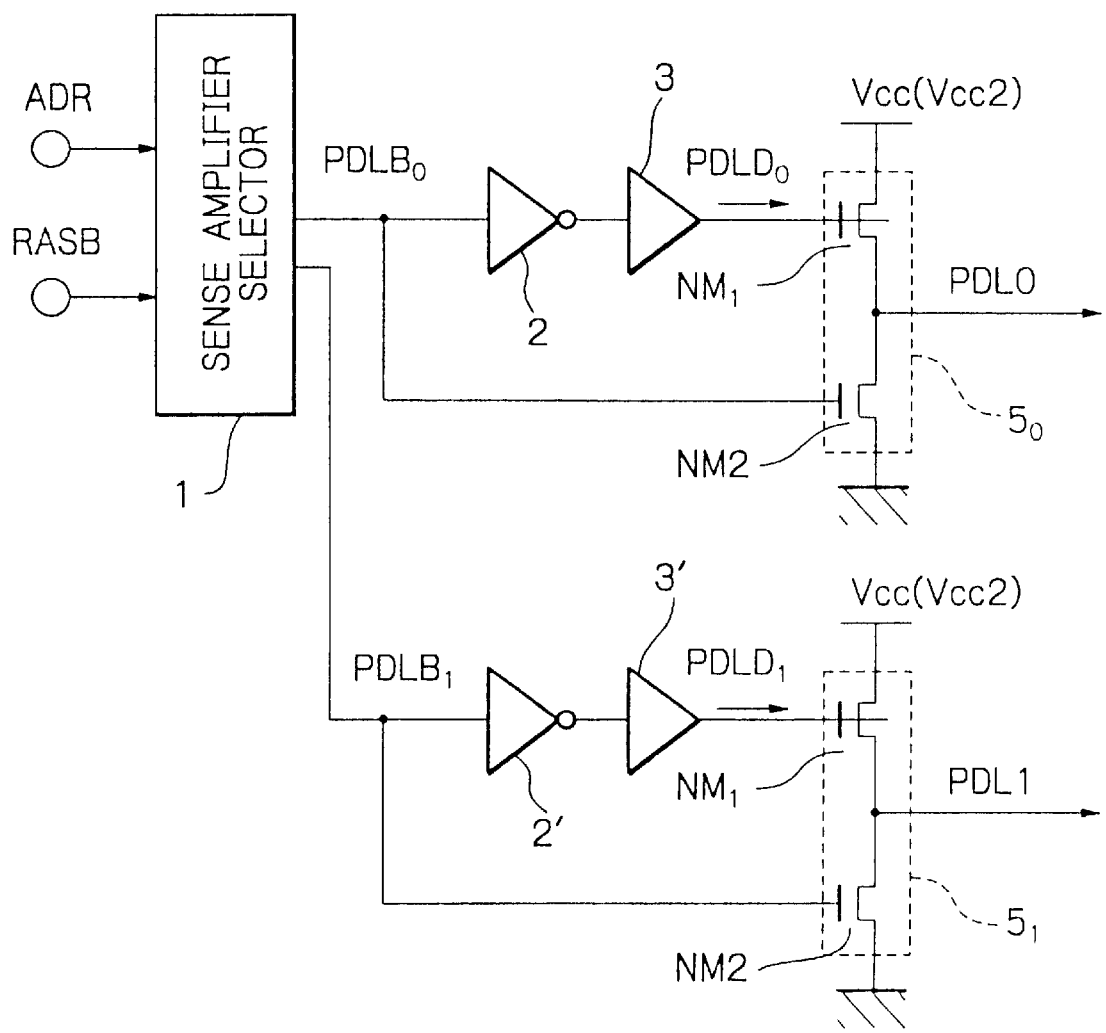
FIG. 10 is a schematic block diagram showing precharge drive circuits included in the illustrative embodiment.

Referring to FIGS. 9 and 10, a semiconductor memory embodying the present invention, particularly sense amplifier precharge circuitry thereof, will be described. In FIGS. 9 and 10, structural elements identical with the structural elements shown in FIGS. 1 and 2 are designated by identical reference numerals and will not be described specifically in order to avoid redundancy. As shown in FIG. 10, a sense amplifier selector 1 receives a control signal RASB from outside the memory and receives an internal address signal ADR from a word line decoder (XDEC or row decoder, FIG. 6). The sense amplifier selector 1 selects a sense amplifier row, e.g., sense amplifiers $SAP_1$ through $SAP_n$ designated by the address signal ADR in synchronism with the control signal RASB.

Further, the sense amplifier selector 1 outputs, in accordance with the address signal ADR, precharge control signals $PDLB_0$ and $PDLB_1$. With the control signals $PDLB_0$ and $PDLB_1$, the selector 1 precharges bit lines $BLT_1$ through $BLT_n$, $BLN_1$ through $BLN_n$, $BLBT_1$ through $BLBT_n$ and $BLBN_1$ through $BLBN_n$ to a preselected precharge voltage (HFVC). As shown in FIG. 10, inverters 2 and 2' respectively invert the polarities of the precharge control signals $PDLB_0$ and $PDLB_1$ output from the selector 1 and feed the inverted control signals to voltage converters 3 and 3', respectively (see FIG. 6).

The voltage converter 3 converts the high-level voltages of the inverted control signal derived from the precharge control signal $PDLB_0$ to a voltage VDV. This voltage VDV is higher than the sum of a power supply voltage Vcc assigned to a logical circuit, not shown, included in the memory and a threshold value $V_{t1}$ assigned to a MOS transistor $NM_1$ included in a precharge drive circuit $5_0$ that is formed in a crossing region CR, i.e., $Vcc+V_{t1}$. The sum $Vcc+V_{t1}$ is output as a precharge drive signal $PDLD_0$. The above MOS transistor $NM_1$ is an n-channel MOS transistor.

Likewise, the voltage converter 3' converts the high-level voltages of the inverted control signal derived from the precharge control signal $PDLB_1$ to a voltage VDV. This voltage VDV is higher than the sum of a power supply voltage Vcc and a threshold value $V_{t1}$ assigned to a MOS transistor $NM_1$ included in a precharge drive circuit $5_1$, i.e., $Vcc+V_{t1}$. The sum $Vcc+V_{t1}$ is output as a precharge drive signal $PDLD_1$.

A boosting circuit, not shown, feeds the voltage VDV as a boosted voltage VBOOT before precharging begins. More specifically, when a control signal RASB in a low level is input from outside the memory, the boosting circuit feeds the boosted voltage VBOOT to the voltage converters 3 and 3'.

The precharge drive circuits $5_0$ and $5_1$ are formed in each crossing region CR, FIG. 6, corresponding to a particular memory cell region MS designated by the address signal ADS. The precharge drive circuits $5_0$ and $5_1$ each have an n-channel MOS transistor $NM_2$ in addition to the n-channel MOS transistor $NM_1$. When the precharge drive signal $PDLD_0$ input to the precharge drive circuit $5_0$ goes high, the drive circuit $5_0$ causes the precharge signal $PDL_0$ to go high. Likewise, when the precharge drive signal $PDLD_1$ input to the precharge drive circuit $5_1$ goes high, the drive circuit $5_1$ causes the precharge signal $PDL_1$ to go high.

More specifically, in the precharge drive circuit $5_0$ or $5_1$, when the precharge drive circuit $PDLD_0$ or $PDLD_1$ input to the gate of the MOS transistor $NM_1$ goes high, the transistor $NM_1$ turns on. Because the precharge drive signal $PDLD_0$ or $PDLD_1$ is higher than $Vcc+V_{t1}$, the precharge signal $PDL_0$ or $PDL_1$ whose high level is identical with Vcc is output. At this instant, the precharge control signal $PDLB_0$ or $PDLB_1$ is opposite in polarity to the precharge drive signal $PDLD_0$ or $PDLD_1$ and is therefore in a low level, maintaining the MOS transistor $NM_2$ in an OFF state. Conversely, when the precharge drive signal $PDLD_0$ or $PDLD_1$ input to the precharge drive circuit $5_0$ or $5_1$respectively, goes low, the drive circuit $5_0$ or $5_1$ causes the precharge signal $PDL_0$ or $PDL_1$ to go low. That is, because the precharge control signal $PDLB_0$ or $PDLB_1$ is opposite in polarity to the precharge drive signal $PDLD_0$ or $PDLD_1$ and is therefore in a high level, maintaining the MOS transistor $NM_2$ in an ON state. This causes the precharge signal $PDL_0$ or $PDL_1$ to go low.

Further, the precharge drive signal $PDLB_0$ or $PDLB_1$ is directly input from the sense amplifier selector 1 to the precharge drive circuit $5_0$ or $5_1$. Therefore, when the signal $PDLB_0$ or $PDLB_1$ goes high, it causes the precharge signal $PDL_0$ or $PDL_1$ to rapidly go low. At this instant, the MOS transistor $NM_1$ remains in an OFF state because the precharge drive signal $PDLD_0$ or $PDLD_1$ is input in a low level.

Precharge circuits $SW_1$ through $SW_n$ each are positioned in a particular region SA, FIG. 6, and made up of n-channel MOS transistors $NM_3$, $NM_4$ and $NM_5$. The sense amplifier $SW_1$ precharges the associated bit line pair $BL_1$ to the preselected voltage HFVC, e.g., Vcc/2 before the sense amplifier $SAP_1$ is activated. Likewise, the precharge circuits $SW_2$ through $SW_n$ respectively precharge the bit line pairs $BL_2$ through $BL_n$ to the above voltage HFVC before the sense amplifiers $SAP_2$ through $SAP_N$ are activated.

The MOS transistor $NM_3$ turns on when the precharge signal $PD_0$ or $PDL_1$ input thereto is in a high level, equalizing the voltages on the bit lines $BLT_1$ and $BLN_1$ of the bit line pair $BL_1$. The MOS transistor $NM_4$ has a drain connected to a power supply that implements the precharge voltage, and a source connected to the bit line $BLT_1$. When the precharge signal $PDL_0$ or $PDL_1$ input to the gate of the transistor $NM_4$ goes high, the transistor $NM_4$ precharges the bit line $BLT_1$ to the voltage Vcc/2. Likewise, the MOS transistor $NM_5$ has a drain connected to the above power supply and a source connected to the bit line $BLN_1$. When the precharge signal $PDL_0$ or $PDL_1$ input to the gate of the transistor $NM_5$, the transistor $NM_5$ precharges the bit line BLN, to the voltage Vcc/2.

The memory cell $MS_1$ and other memory cells, not shown, are connected to the bit line $BLT_1$ while a memory cell $MS_2$ and other memory cells are connected to the bit line $BLN_1$. Memory cells, not shown, are also connected to the bit lines of the bit line pairs $BL_2$ and $BL_n$ in the same manner. A word line (subword line) $SWL_0$ is connected to the memory cells $MS_1$, $MS_3$ . . . , $MS_{(m-3)}$, $MS_{(m-1)}$ while a word mine (subword line) $SWL_1$ is connected to the memory cells $MS_2$, $MS_4$, . . . $MS_{(m-2)}$, $MS_m$.

Precharge circuits $SWB_1$ through $SWB_n$ are identical in configuration with the precharge circuits $SW_1$ through $SW_n$. The precharge circuit $SWB_1$, for example, precharges the associated bit line pair $BLB_1$ to the preselected voltage HFVC, e.g., Vcc/2. The precharge circuits $SWB_2$ through $SWB_n$ deal with the bit line pairs $BLB_2$ through $BLB_n$, respectively.

The illustrative embodiment has a segmental word line configuration in which main word lines (outputs of the row decoders XDEC, FIG. 6) each are divided into subword lines (outputs of subrow decoders SWD, FIG. 6). With this configuration, the illustrative embodiment selects the memory cells.

The memory cells $MS_1$ through $MS_m$ each are formed in a particular memory cell region MS shown in FIG. 6 and made up of an n-channel MOS transistor NM50 and acapacitor C. In the memory cell $MS_1$, for example, the MOS transistor NM50 has a gate connected to the word line $SWL_0$, a drain connected to the bit line $BLT_1$, and a source connected to one end of the capacitor C. The other end of the capacitor C is connected to a power supply capable of outputting a preselected voltage, e.g., Vcc/2. The other memory cells $MS_2$ through $MS_m$ (m being a natural number) are identical in configuration with the memory cell $MS_1$.

The capacitor C stores data in the form of a charge on the basis of voltage level. Specifically, the capacitor C stores a voltage higher than Vcc/2 as high-level data and stores a voltage lower than Vcc/2 as low-level data, thereby holding or storing the data.

For example, assume that the subrow decoder SWD, FIG. 6, selects the word line $SWL_0$ in accordance with the address signal fed from the row decoder XDEC and activates it, i.e., causes it to go high. Then, the MOS transistor NM50 in the memory cell MS, turns on. As a result, when high-level data, for example, is stored in the capacitor C, the charge stored in the capacitor C is transferred to the bit line $BLT_1$. Consequently, the voltage on the bit line $BLT_1$ 5 is raised by a value corresponding to a capacity ratio between the bit line $BLT_1$ and the capacitor C.

Conversely, when low-level data is stored in the capacitor C, a charge on the bit line $BLT_1$ is transferred to the capacitor C on the activation of the word line $SWL_0$. As a result, the voltage on the bit line $BLT_1$ is lowered by the capacity ratio between the bit line $BLT_1$ and the capacitor C. The other memory cells $MS_2$ through $MS_m$ are identical in operation with the memory cell $MS_1$ except that they deal with the bit lines $BLT_2$ through $BLT_n$ and $BLN_2$ through $BLN_n$.

Sense preamplifier precharge circuits SPD each are formed in a particular crossing region CR, FIG. 6, and made up of n-channel MOS transistors $MN_{20}$, $NM_{21}$, $MN_{30}$, $MN_{31}$, $MN_{32}$ and $MN_{33}$. The MOS transistor $MN_{20}$ has a drain connected to the power supply line SAP and a source connected to the drain of the MOS transistor $MN_{21}$. The MOS transistor $MN_{21}$ has a source connected to the power supply line (ground line) SAN. In this configuration, when the precharge signals $PDL_0$ and $PDL_1$ both are in a high level, the MOS transistors $MN_{20}$ and $MN_{21}$ are turned on and equalize the voltages on the power supply lines SAP and SAN.

The power supply line SAP is connected to the source of the MOS transistor $MN_{30}$. The drain of the MOS transistor $MN_{30}$ and the source of the MOS transistor $MN_{31}$ are connected to each other. The drain of the MOS transistor $MN_{31}$ is connected to a signal line that feeds the precharge voltage HFVC. Likewise, the power supply line SAN is connected to the source of the MOS transistor $MN_{33}$. The drain of the MOS transistor $MN_{33}$ and the source of the MOS transistor $MN_{32}$ are connected to each other. Further, the drain of the MOS transistor $MN_{32}$ is connected to the line that feeds the precharge voltage HFVC.

When the precharge signals $PDL_0$ and $PDL_1$ both are in a high level, all of the MOS transistors $MN_{30}$ through $MN_{33}$ are turned on. As a result, the precharge current is fed from the signal line, which feeds the precharge voltage HFVC, to the power supply lines SAP and SAN, precharging the lines SAP and SAN to the voltage HFVC. Consequently, the sense amplifiers $SAP_1$ through $SAP_n$ output voltages equal to the precharge voltage HFVC.

The bit lines $BLT_1$ through $BLT_n$ and bit lines $BLN_1$ through $BLN_n$, forming bit line pairs $BL_1$ through $BL_n$, respectively, are connected to the sense amplifiers $SAP_1$ through $SAP_n$, respectively. The sense amplifiers $SAP_1$ through $SAP_n$ each are formed at a particular region SA, FIG. 6, for amplifying a voltage difference between the associated bit lines to thereby detect data stored in the capacitor C. When the sense amplifiers $SAP_1$ through $SAP_n$ are activated, a power supply circuit, not shown, feeds a voltage necessary for the operation of the amplifiers $SAP_1$ through $SAP_n$ via the power supply lines SAP and SAN. That is, the sense amplifiers $SAP_1$ through $SAP_n$ are disconnected from the power supply circuit when deactivated.

The sense amplifiers $SAP_1$ through $SAP_n$ are flip-flop type sense amplifiers each having two lower n-channel MOS transistors and two upper p-channel MOS transistors with arrows. The sense amplifiers $SAP_1$ through $SAP_n$ each amplify a voltage difference between the bit lines of associated one of the bit line pairs $BL_1$ through $BL_n$ and $BLB_1$ through $BLB_n$. Further, before a time for amplification, the power supply signal SAP goes high (power supply voltage Vcc) for feeding power while the power supply signal SAN goes low (ground potential). As a result, the sense amplifiers $SAP_1$ through $SAP_n$ are activated.

Y switches are arranged in regions YDEC shown in FIG. 6 and select the data detected by the sense amplifiers $SAP_1$ through $SAP_n$ on the basis of the column address. A data amplifier, not shown, amplifies the data selected to the width between the ground potential and the power supply voltage Vcc. The amplified data are sent to external circuitry via an output buffer and an I/O circuit PIO shown in FIG. 6.

Figure 11:
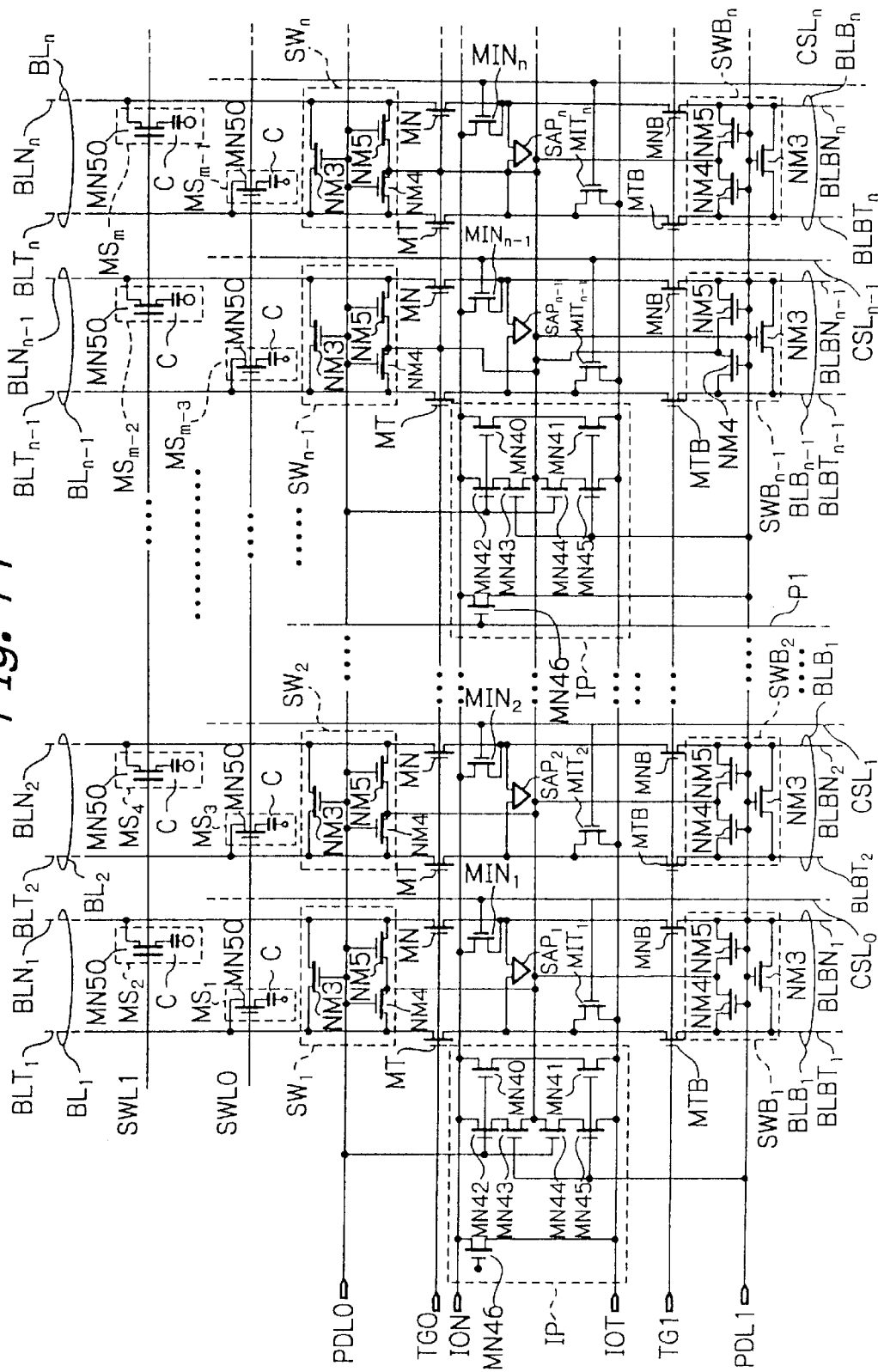
FIG. 11 is a schematic block diagram showing I/O line precharge circuitry included in an alternative embodiment of the present invention.

Referring to FIG. 11, an alternative embodiment of the present invention is shown that precharges I/O lines included in a semiconductor memory. In FIG. 11, structural elements identical with the structural elements shown in FIGS. 1, 2, 9 and 10 are designated by identical reference numerals and will not be described specifically in order to avoid redundancy.

As shown, I/O lines IOT and ION are connected to the output of the sense amplifier SAP, via n-channel MOS transistors MIT, and $MIN_1$, respectively. Also, the I/O lines IOT and ION are connected to the outputs of the sense amplifiers $SAP_2$ through $SAP_n$ via n-channel MOS transistors $MIT_2$ and $MIN_2$ through n-channel MOS transistors $MIT_n$ and $MIN_n$, respectively.

I/O precharge circuits IP each are positioned at a particular crossing region, FIG. 6, and made up of n-channel MOS transistors $MN_{40}$, $MN_{41}$, $MN_{42}$, $MN_{43}$, $MN_{44}$, $MN_{45}$ and $MN_{47}$. The MOS transistor $MN_{40}$ has a drain connected to the I/O line ION and a source connected to the drain of the MOS transistor $MN_{41}$. The MOS transistor $MN_{41}$ has a source connected to the I/O line IOT. In this configuration, when the precharge signals $PDL_0$ and $PDL_1$ both are in a high level, the MOS transistors $MN_{20}$ and $MN_{21}$ turn on and equalize the voltages on the I/O lines IOT and ION.

The MOS transistor $MN_{42}$ has a source connected to the I/O line ION and a drain connected to the source of the MOS transistor $MN_{43}$. The MOS transistor $_{43}$ has a drain connected to a signal line that feeds the precharge voltage HFVC. Likewise, the MOS transistor $MN_{45}$ has a source connected to the I/O line IOT and a drain connected to the source of the MOS transistor $MN_{44}$. The MOS transistor $MN_{44}$ has a drain connected to the line that feeds the precharge voltage HFVC.

When the precharge signals $PDL_0$ and $PDL_1$ both are in a high level, all of the MOS transistors $MN_{42}$ through $MN_{45}$ turn on. As a result, the precharge current HFVC flows from the above line through the I/O lines IOT and ION, precharging the lines IOT and ION to the voltage HFVC.

The bit lines $BLT_1$ through $BLT_n$ and bit lines $BLN_1$ through $BLN_n$ forming bit line pairs $BL_1$ through $BL_n$, respectively, are connected to the sense amplifiers $SAP_1$ through $SAP_n$, respectively. The sense amplifiers $SAP_1$ through $SAP_n$ each are formed at a particular region SA, FIG. 6, for amplifying a voltage difference between the associated bit lines to thereby detect data stored in the capacitor C.

Column decoders, not shown, output control signals $CSL_1$ through $CSL_n$ on the basis of the column address. The I/O lines IOT and ION are connected to the output terminal of one of the sense amplifiers $SAP_1$ through $SAP_n$ in accordance with the control signals $CSL_1$ through $CSL_n$. Specifically, one of the control signals $CSL_1$ through $CSL_n$ goes high at a time. When the control signal $CSL_1$, for example, goes high, the MOS transistors $MIT_1$ and $MIN_1$ are turned on and connect the I/O lines IOT and ION to the output terminal of the sense amplifier $SAP_1$.

The Y switches arranged in the regions YDEC, FIG. 6, select the data detected by the sense amplifiers $SAP_1$ through $SAP_n$ on the basis of the column address. The data amplifier amplifies the data selected to the width between the ground potential and the power supply voltage Vcc. The amplified data are sent to external circuitry via the output buffer and I/O circuit PIO, FIG. 6.

Figure 12:
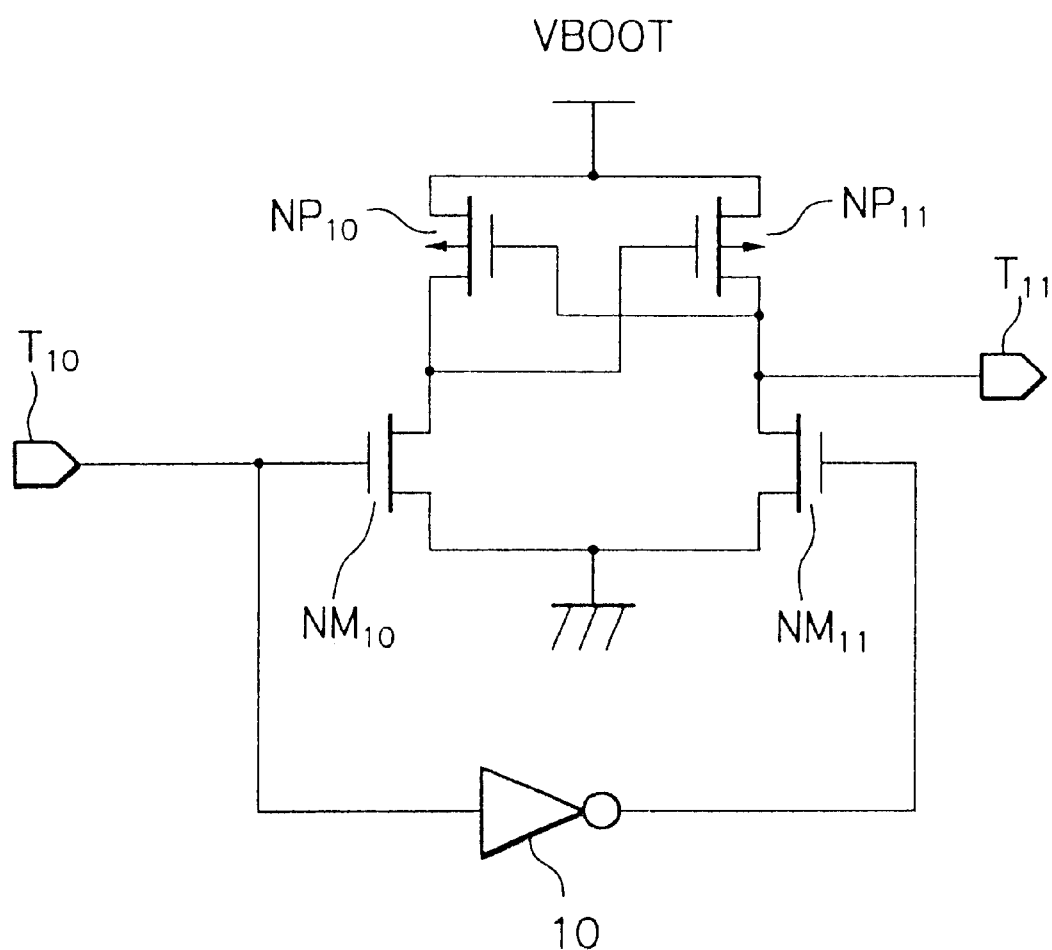
FIG. 12 is a circuit diagram showing a specific configuration of a voltage converter included in one of the precharge drive circuits shown in FIG. 10.

FIG. 12 shows a specific configuration of each of the voltage converters 3 and 3', FIG. 10. As shown, a p-channel MOS transistor $NP_{10}$ has a source connected to a boosted voltage source VBOOT, a gate connected to a terminal 11, and a drain connected to the drain of a MOS transistor 10. Before the start of a precharging operation, the boosting circuit, not shown, applies the boosted voltage VBOOT to the voltage converter 3 (3'). The voltage output form the boosted voltage source VBOOT is higher than the voltage Vcc+$V_{t1}$ defining the high level of the precharge drive signals PDLD.

More specifically, before the precharging operation, the boosting circuit feeds the boosted voltage VBOOT to the source of the MOS transistor $NP_{10}$ and the source of a p-channel MOS transistor $NP_{11}$. The voltage converter 3 (3') can therefore deliver the boosted voltage VBOOT to the precharge drive circuits $5_1$ through $5_q$ before the start of a precharging operation.

The MOS transistor $NP_{11}$ has a source connected to the boosted voltage source VBOOT, a gate connected to the drain of the MOS transistor 10, and a drain connected to the terminal $T_{10}$. An n-channel MOS transistor $NM_{10}$ has a source connected to ground, a drain connected to the drain of the MOS transistor 10, and a gate connected to a terminal T10. An n-channel MOS transistor $NM_{11}$ has a source connected to ground, a drain connected to the drain of the MOS transistor $NP_{11}$, and a gain connected to the output of an inverter 10. The inverter 10 inverts the output of the inverter 2, FIG. 10, input via the terminal $T_{10}$ and feeds its output to the gate of the MOS transistor $NM_{11}$.

The gate of the MOS transistor $NP_{10}$ is connected to the drain of the MOS transistor $NP_{11}$ while the gate of the MOS transistor $NP_{11}$ is connected to the drain of the MOS transistor $NP_{10}$, as stated above. This configuration allows the gates of the MOS transistors $NP_{10}$ and $NP_{11}$ to remain at the high level of the boosted voltage source VBOOT and therefore fully turned off.

For example, assume that the sense amplifier selector 1 causes the precharge control signal $PDLB_0$ input to the inverter 2 to go high. Then, the inverter 2 inverts the precharge control signal $PDLB_0$ and outputs a high-level inverted signal. The inverted high-level signal is input to the voltage converter 3 via the input $T_{10}$. The high-level signal is fed to the gate of the MOS transistor $NM_{10}$, causing the drain of the transistor $NM_{10}$ to go low. At the same time, the high-level signal is applied to the input of the inverter 10. The inverter 10 again inverts the high-level signal and delivers the resulting low-level signal to the gate of the MOS transistor $NM_{11}$. As a result, the MOS transistor $NM_{11}$ is caused to turn off.

Consequently, the MOS transistor $NP_{11}$ causes its gate to go low and turns on. This, coupled with the fact that the MOS transistor $NM_{11}$ has turn off, causes the voltage level on the terminal $T_{11}$ to go high. The MOS transistor $NP_{10}$ causes its gate to go low and therefore turns off. As a result, the voltage on the drain of the MOS transistor $NM_{10}$ drops to a low level close to the ground voltage.

As stated above, when the sense amplifier selector 1 causes the precharge control signal $PDLB_0$ ($PDLB_1$) to go low, the voltage converter 3 (3') outputs the precharge drive signal $PDLD_0$ ($PDLD_1$) equal in level to the boosted voltage VBOOT (voltage VDV) higher than the voltage Vcc+$V_{t1}$.

Conversely, when the sense amplifier selector 1 causes the precharge control signal $PDLB_0$ to go high, the inverter 2 produces the signal $PDLB_0$ and outputs an inverted low-level signal. The low-level signal is input to the voltage converter 3 via the terminal $T_{10}$. The MOS transistor $NM_{10}$ receives the low-level signal via its gate and turns off. At the same time, the low-level signal is applied to the input of the inverter 10. The inverter 10 again inverts the low-level signal and delivers the resulting high-level signal to the gate of the MOS transistor $NM_{11}$, causing the transistor $NM_{11}$ to turn on.

Consequently, the MOS transistor $NP_{11}$ causes its gate to go high and turns off. This, coupled with the fact that the MOS transistor $NM_{11}$ has turned on, lowers the voltage on the terminal $T_{11}$ to a low level. The MOS transistor $NP_{10}$ causes its gate to go low and therefore turns on. As a result, the voltage on the drain of the MOS transistor $NM_{10}$ rises to a high level equal to the boosted voltage VBOOT.

As stated above, when the sense amplifier selector 1 causes the precharge control signal $PDLB_0$ ($PDLB_1$) to go high, the voltage converter 3 (3') outputs the precharge drive signal $PDLD_0$ ($PDLD_1$) in a low level equal to the ground voltage. The terminal $T_{10}$ is connected to the output terminal of the inverter 2 (2') while the terminal $T_{11}$ is connected to the gate of the MOS transistor $NM_1$ included in the precharge drive circuit $5_0$ ($5_1$)

Figure 13:
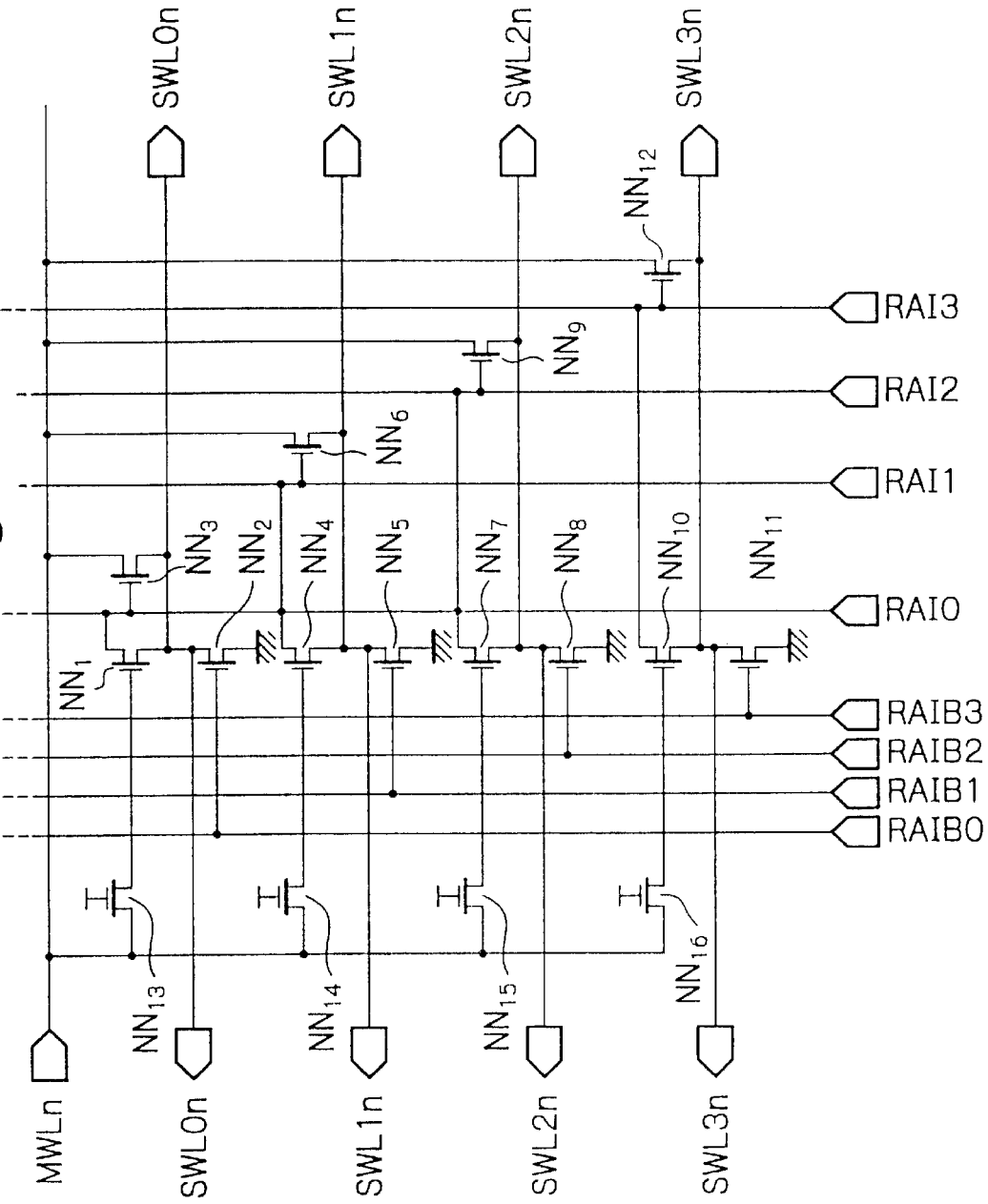
FIG. 13 is a schematic block diagram showing a subrow decoder included in the configuration of FIG. 6.

Reference will be made to FIG. 13 for describing the subrow decoders SWD, FIGS. 6 and 9, that activate word lines $SW_0$ and $SW_1$ shown in FIG. 9. As shown, the subrow decoders SWD include n-channel MOS transistors $NN_1$ through $NN_{16}$. When a main word line $MWL_n$ is activated, a preselected high-level voltage appears on the line $MWL_n$ and causes the gate of the MOS transistor $NN_1$ to go high via the MOS transistor $NN_{13}$. As a result, the MOS transistor $NN_1$ turns on. At the same time, the high-level voltage on the main word line $MWL_n$ causes the gates of the MOS transistors $NN_4$, $NN_7$ and $NN_{10}$ to go high via the MOS transistors $NN_{14}$ through $NNz_{16}$, respectively, thereby turning on the transistors $NN_4$, $NN_7$ and $NN_{10}$.

The MOS transistors $NN_{13}$ through $NN_{16}$ have their gates pulled up to a high level by a preselected voltage. In this sense, the MOS transistors $NN_{13}$ through $NN_{16}$ constitute a constant voltage circuit. Internal address signals $RAI_0$ through $RAI_3$ and internal address signals $RAIB_0$ through $RAIB_3$ are output from a main word line decoder XDEC on the basis of the row address fed from outside the memory.

The address signals $RAI_0$ and $RAIB_0$, the address signals $RAI_1$ and $RAIB_1$, the address signals $RAI_2$ and $RAIB_2$ and the address signals $RAI_3$ and $RAIB_3$ are complementary in level to each other. When the address signal $RAI_0$, for example, is in a high level, the address signal $RAIB_0$ is in a low level; when the former is in a low level, the latter is in a high level. This relation also applies to the other address signals complementary to each other.

Specifically, assume that the main word line $MWL_n$ is activated to a high level and that the address signal $RAI_0$ is in a high level while the address signals $RAI_1$ through $RAI_3$ are in a low level. Then, the address signal $RAIB_0$ is in a low level while the address signals $RAIB_1$ through $RAIB_3$ are in a high level. As a result, the MOS transistor $NN_1$ turns on while the MOS transistor $NN_2$ turns off. In response, the preselected high-level voltage of the address signal $RAI_0$ causes the gate of the MOS transistor $NN_3$ to go high and thereby turns on the transistor $NN_3$. Consequently, the word line $SWL_{0n}$ is activated to a high level.

On the other hand, the MOS transistors $NN_6$, $NN_9$ and $NN_{12}$ turn off due to the low level of the address signals $RAI_1$ through $RAI_3$. Also, the MOS transistors $NN_5$, $NN_8$ and $NN_{11}$ turn on due to the high level of the address signals $RAIB_1$ through $RAIB_3$. Therefore, the word lines $SWL_{1n}$ through $SWL_{3n}$ are not activated and remain in a low level.

Figure 14:
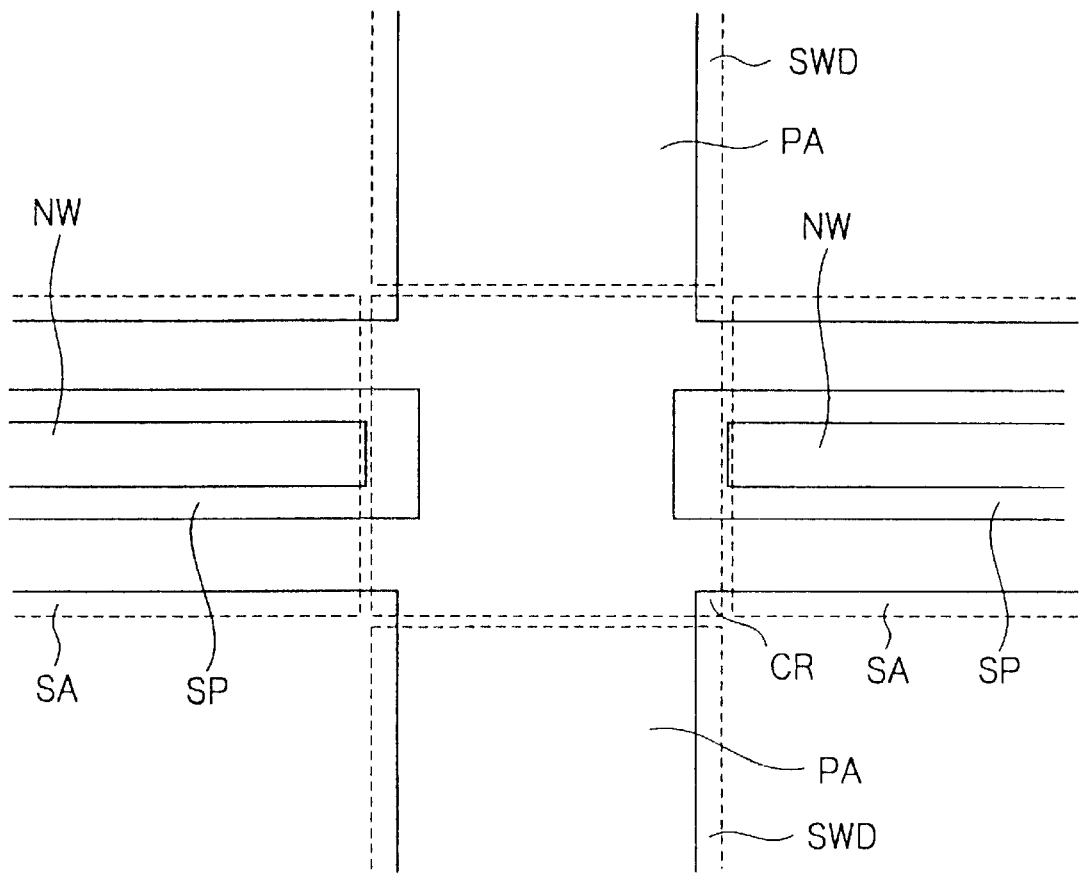
FIG. 14 is a fragmentary enlarged view showing a crossing region also included in the configuration of FIG. 6.

As stated above, in the illustrative embodiment, all of the sense amplifier precharge circuits SPD and I/O line precharge circuits IP are fully implemented by n-channel MOS transistors. It is therefore not necessary to form in the crossing region CR the n-well regions NW and therefore the separating regions SP for separating the n-well regions NW from p-well regions. This is clearly shown in FIG. 14 that is an enlarged view of the portion T of FIG. 6. As shown, the sense amplifier precharge circuits SPD and I/O precharge circuits IP can be formed in the crossing regions CR by use of MOS transistors having a broader channel width than conventional without increasing the chip size. The crossing regions CR and subrow decoders SWD are implemented by p-wells (or p-type substrate) where the n-channel MOS transistors are formed. In FIG. 14, the n-channel MOS transistors are formed in regions PA.

In the illustrative embodiment, the MOS transistors constituting the sense amplifier precharge circuits SPD and I/O line precharge circuits IP are not p-channel MOS transistors formed in n-wells, but are n-channel transistors. A higher degree of carrier migration is achievable with n-channel transistors than p-channel transistors. This is successful to improve conductance in the ON state and promote rapid precharging. The illustrative embodiment therefore reduces a period of time up to the start of precharging, i.e., the access time.

Further, the precharge drive voltage $PDLD_0$ higher than "Vcc (potential of n-wells where the sense amplifiers $SA_1$ through $SA_n$ are formed)+$V_{t1}$ (threshold voltage of the MOS transistor $NM_1$)" is input to the gate of the MOS transistor $NM_1$. It is therefore possible to cause a current for rapidly turning on the MOS transistors of the circuits SPD and IP to flow to the gates of the transistors. This is also successful to promote rapid precharging and to reduce the access time.

Moreover, the boosting circuit, not shown, feeds the boosted voltage VBOOT assigned to the precharge drive signals PDLD to the sources of the MOS transistors $NP_{10}$ and $NP_{11}$, FIG. 12, before the start of a precharging operation. That is, the boosted voltage VBOOT is therefore applied to the precharge drive circuits $5_0$ and $5_1$ before a precharging operation. The voltage converter 3 (3') can therefore rapidly bring the precharge signal PDLD0 (PDLD1) to the boosted voltage VBOOT at the same time as the sense amplifier selector 1 outputs the selection signal $PDLB_0$ ($PDLB_1$). It follows that the precharge signal $PDL_0$ ($PDL_1$) can rapidly vary from a low level to a high level.

A specific operation of the semiconductor memory shown in FIGS. 9 and 10 will be described with reference to FIG. 4. It is to be noted that portions whose functions are not described are identical with the conventional portions.

FIG. 4 shows how data is read out of the memory cell $MS_1$ by way of example. In this case, the control signal RASB is in a high level, so that the control signals $PDLB_0$ and $PDLB_1$ are in a low level. In this condition, the voltage converter 3 delivers the precharge drive signal $PDLD_0$ higher than $Vcc+V_{t1}$ to the precharge drive circuit $5_0$. The precharge drive circuit $5_0$ therefore feeds the precharge signal $PLD_0$ equal to Vcc to the sense amplifier precharge circuits SPD and precharge circuits $SW_1$ through $SW_n$. Likewise, the voltage converter 3' delivers the precharge drive signal $PDLD_1$ higher than $Vcc+V_{t1}$ to the precharge drive circuit $5_1$. The precharge drive circuit $5_1$ therefore feeds the precharge signal $PLD_1$ equal to Vcc to the sense amplifier precharge circuits SPD, I/O line precharge circuits IP, and precharge circuits $SWB_1$ through $SWB_n$.

Each sense amplifier precharge circuit SPD therefore precharges the power supply lines SAP and SAN. At the same time, the precharge circuits $SW_1$ through $SW_n$ precharge the bit lines of the associated bit line pairs $BL_1$ through $BL_n$. Further, the precharge circuits $SWB_1$ through $SWB_n$ precharge the bit lines of the associated bit line pairs $BLB_1$ through $BLB_n$.

When a preselected address designating the memory cell $MS_1$ is input at a time $t_1$, a row address decoder, not shown, outputs an internal address signal ADR. At the same time, the control signal RASB input from the outside goes low. At a time $t_2$, in response to the control signal RASB, the sense amplifier selector 1 delivers high-level control signals $PDLB_0$ and $PDLB_1$ to the precharge drive circuits $5_0$ and $5_1$ respectively, assigned to the sense amplifier row that corresponds to the address decoder. As a result, the precharge signals $PDL_0$ and $PDL_1$ start going low. This is the end of the operation for precharging the power supply lines SAP and SAN and the bit lines of the bit line pairs $BL_1$ through $BL_n$. At the same time, the supply of the boosted voltage VBOOT to the voltage converter 3 ends.

Consequently, the MOS transistors $MN_{20}$ and $MN_{21}$ intervening between the power supply lines SAP and SAN turn off, causing the sense amplifier precharge circuits SPD to stop equalizing the power supply lines SAP and SAN. Consequently, the power supply lines SAP and SAN become open, i.e., they are not electrically connected to any portion of the circuitry.

Likewise, the MOS transistors of the precharge circuits $SW_1$ through $SW_n$ that equalize the bit lines of the bit line pairs $BL_1$ through $BL_n$ turn off. For example, the MOS transistor $NM_3$ for equalizing the bit lines $BLT_1$ and $BLN_1$ of the bit line pair $BL_1$ turns off. In addition, the MOS transistors $NM_4$ and $NM_5$ for feeding the precharge current turn off. The bit lines of the bit line pairs $BL_1$ and $BL_n$ are therefore open, i.e., they are not electrically connected to any portion of the circuitry.

At this instant, the power supply lines SAP and SAN are charged to, e.g., the precharge voltage HFVC (Vcc/2). Likewise, the bit lines of the bit line pairs $BL_1$ through $BL_n$ are charged to, e.g., the voltage HFVC (Vcc/2). A period of time $T_{23}$ between the time $t_2$ and a time $t_3$ begins when the control signals PDL go high and ends when the precharging of the bit line pairs ends.

At the time $t_3$, a circuit, not shown, causes the control signal RAE for activating a word line to go high. In this sense, the period of time $T_{23}$ between the times $t_2$ and $t_3$ is a period of time necessary for the precharging operation to fully end after the precharge signals $PDL_0$ and $PDL_1$ have started going high. At a time $t_5$, due to the high level of the control signal RAE, the subword decoder SWD, FIG. 13, causes the word line $SWL_0$ to go high and thereby activates it.

At a time $t_6$, the MOS transistor $MN_{50}$ of the memory cell $MS_1$ turns on due to the activation of the word line $SWL_0$. As a result, a charge stored in the capacitor C and representative of data starts migrating toward the bit line $BLT_1$. The voltage on the bit line $BLT_1$ is raised from the voltage HFVC by a voltage corresponding to the charge transferred from the capacitor C. On the other than, the bit line $BLN_1$ remains at the same voltage because the word line $SWL_1$ is in a low level, i.e., because a charge is not transferred from the memory cell $MS_2$ connected to the bit line $BLN_1$.

More specifically, assume that high-level data is stored in the memory cell $MS_1$. Then, the charge stored in the capacitor C of the memory cell $MS_1$ is fed to the bit line $BLT_1$ and raises the voltage on the bit line $BLT_1$ above the precharge voltage Vcc/2. On the other hand, the bit line or dummy line $BLN_1$ remains at the precharge voltage Vcc/2.

At a time $t_7$, after the word line $SWL_0$ has reached the high level, the charge stored in the capacitor C of the memory cell $MS_1$ is transferred to the bit line $BLT_1$ with the result that the voltage of the capacitor C and that of the bit line $BLT_1$ are equilibrated. At this time, the circuit, not shown, causes the control signal SE1 to go high. In response, the power supply circuit, not shown, feeds the voltage Vcc and ground potential to the power supply lines SAP and SAN, respectively, thereby activating the sense amplifiers $SAP_1$ through $SAP_n$.

At a time $t_8$, the circuit, not shown, causes the control signal TGO to go high and thereby turns on the MOS transistors MT and MN. Consequently, the bit lines $BLT_1$ and $BLN_1$ are connected to the sense amplifier $SAP_1$. Also, the bit lines $BLT_2$ through $BLT_n$ and bit lines $BLN_2$ through $BLN_n$ are respectively connected to the sense amplifiers $SAP_2$ through $SAP_n$. Therefore, as the voltages on the power supply lines SAP and SAN approach the voltage Vcc and ground voltage, respectively, the voltage difference between the bit lines $BLT_1$ and $BLN_1$ is sequentially amplified.

The sense amplifier SAP, delivers the amplified voltage difference between the bit lines $BLT_1$ and $BLN_1$ to the output driver, not shown, in the form of high-level data via the column switch and data amplifier, not shown, in accordance with a column address fed from the outside.

At a time $t_{12}$, the control signal RASB goes high. Then, at a time $t_{13}$, the control signal RAE goes low in order to deactivate the word line $SWL_0$. Subsequently, at a time $t_{15}$, the subword line decoder causes the word line $SWL_0$ to go low because the control signal RAE has gone low. Consequently, the memory cell $MS_1$ and the other memory cells connected to the word line $SWL_0$ are disconnected from the bit line $BLT_1$ and the other bit lines, respectively, and become open. Likewise, the control signal TGO goes low to turn off the MOS transistors MT and MN. As a result, the bit lines $BLT_1$ through $BLT_n$ and $BLN_1$ through $BLN_n$ are disconnected from the sense amplifiers $SAP_1$ through $SAP_n$, respectively, and become open.

At a time $t_{18}$, the control signal SE1 is caused to go low because the word line $SWL_1$ is in a low level and because the memory cell $MS_1$ is disconnected from the bit line $BLT_1$. As a result, the power supply lines SAP and SAN are disconnected from the power supply circuit and become open.

At a time $t_{19}$, the sense amplifier selector 1 causes the precharge control signals $PDLB_0$ and $PDLB_1$ to go low because the power supply lines SAP and SAN are fully open. In response, the voltage converter 3 raises the precharge drive signal $PDLD_0$ from a low level equal to the ground potential to a high level equal to $Vcc+V_{t1}$. Likewise, the voltage converter 3' raises the precharge drive signal $PDLD_1$ from a low level equal to the ground potential to a high level equal to $Vcc+V_{t1}$. The precharge circuits $5_0$ and $5_1$ respectively cause the precharge signals $PDL_0$ and $PDL_1$ to go high.

At a time $t_{20}$, the sense amplifier precharge circuit SPD starts precharging the power supply lines SAP and SAN due to the high level of the precharge signals $PDL_0$ and $PDL_1$. Likewise, the precharge circuits $SW_1$ through $SW_n$ respectively start charging the bit line pairs $BL_1$ through $BL_n$ connected thereto. Further, the precharge circuits $SWB_1$ through $SWB_n$ respectively start charging the bit line pairs $BLB_1$ through $BLB_n$ connected thereto.

At a time $t_{22}$, the sense amplifier precharge circuit SPP precharges the power supply lines SAP and SAN to the voltage HFVC (precharge voltage Vcc/2) and then ends precharging. By contrast, the conventional sense amplifier precharge circuit must continue precharging up to the time $t_{23}$.

At a time $t_{24}$, the precharge circuits $SW_1$ through $SW_n$ respectively precharge the bit lines of the bit line pairs $BL_1$ through $BL_n$ to the voltage HFVC while equalizing them. The precharge circuits $SWB_1$ through $SWB_n$ respectively precharge the bit lines of the bit line pairs $BLB_1$ through $BLB_n$ to the voltage HFVC while equalizing them. This is the end of the precharging operation. By contrast, the conventional sense amplifier precharge circuit must continue precharging up to the time $t_{25}$.

In the illustrative embodiment, the sense amplifier precharge circuit SPD replaces the conventional AND gate $M_1$ including p-channel MOS transistors with the n-channel MOS transistors $MN_{30}$, $MN_{31}$, $MN_{32}$ and $MN_{33}$ that implement more rapid charge migration than p-channel MOS transistors. In addition, the precharge drive signals $PDLD_0$ and $PDLD_1$ have a high level equal to the boosted voltage VBOOT that is higher than $Vcc+V_{t1}$.

With the above configuration, the illustrative embodiment allow the precharge signals $PDL_0$ and $PDL_1$ to rapidly go high and therefore promote rapid transition of the MOS transistors $MN_{30}$ through $MN_{33}$ to an ON state. Further, the MOS transistors $MN_{30}$ through $MN_{33}$ can have a broader channel width than p-channel transistors and can therefore have their conductance increased. It follows that the sense amplifier precharging time beginning at the time $t_{22}$ can be reduced without increasing the area of the crossing region at all, compared to the conventional semiconductor memory. That is, the illustrative embodiment promotes rapid access without increasing the chip area of the semiconductor memory.

In the precharge drive circuit $5_0$ ($5_1$), the MOS transistors $NM_2$ may be provided with a broader channel with than the MOS transistor $NM_1$. In such a configuration, even if a penetrating current is caused to flow between the MOS transistors $NM_1$ and $NM_2$ at the end of precharging of the bit lines, the transistor $MN_2$ is capable of causing the current of the transistor $MN_1$ to sufficiently flow to ground. This allows the precharge signal to rapidly vary from a high level to a low level.

Moreover, in the illustrative embodiment, the high-level voltage of the precharge signals $PDL_0$ and $PDL_1$ may be made higher than the voltage Vcc. This successfully enhances the ON-state conductance of the MOS transistors $MN_{20}$, $MN_{21}$, $MN_{30}$, $MN_{31}$, $MN_{32}$ and $MN_{33}$ constituting the sense amplifier precharge circuit SPD and the ON-state conductance of the MOS transistors $NM_3$ through $NM_5$ constituting the precharge circuits $SW_1$ through $SW_n$. In this case, a boosted voltage $Vcc_2$ higher than the voltage Vcc (potential of n-wells where the sense amplifiers $SA_1$ through $SA_n$ are formed) is applied to the drain of the MOS transistor $NM_1$ included in each of the precharge drive circuits $5_0$ and $5_1$. The boosted voltage $Vcc_2$ drives the MOS transistors $MN_{20}$, $MN_{21}$, $MN_{30}$, $MN_{31}$, $MN_{32}$, $MN_{33}$, $NM_3$, $NM_4$ and $NM_5$. At this instant, the precharge drive signals $PDLD_0$ and $PDLD_1$ should preferably have a voltage higher than $Vcc_2+V_{t1}$.

In the above configuration, the boosting circuit, not shown, applies a boosted voltage VBOOT higher than the voltage $Vcc_2+V_{t1}$ to the voltage converter 3. It is to be noted that the boosted voltage $Vcc_2$ is generated by a power supply different from the power supply that generates the boosted voltage VBOOT. This kind of scheme is successful to efficiently apply the voltage $Vcc_2$ to the MOS transistors $MN_{20}$, $MN_{21}$, $MN_{30}$, $MN_{31}$, $MN_{32}$, $MN_{33}$, $NM_3$, $NM_4$ and NM5. Therefore, there can be improved the ON-state conductance of the MOS transistors $MN_{20}$, $MN_{21}$, $MN_{30}$, $MN_{31}$, $MN_{32}$, $MN_{33}$, $NM_3$, $NM_4$ and $NM_5$.

The sense amplifier precharge circuit SPD therefore allows more charge current to flow for the power supply lines SAP and SAN than the conventional sense amplifier, thereby saving the precharging time allocated to the power supply lines SAP and SAN. Further, because the conductance of the MOS transistors $MN_{20}$ and $MN_{21}$ decreases, the sense amplifier precharge circuit SPD allow the voltages of the power supply lines SAP and SAN to be closer to each other as a result of equalization. It is noteworthy that because the MOS transistor $NM_1$ included in each of the precharge drive circuits $5_0$ and $5_1$ is not a p-channel MOS transistor, a boosted voltage higher than the voltage Vcc (potentials of n-wells where the sense amplifiers $SA_1$ through $SA_n$ are formed) can be applied to the drain of the transistor $NM_1$.

Reference will be made to FIG. 5 for describing a specific operation of the illustrative embodiment shown in FIGS. 10 and 11. Portions whose functions are not described are identical with the portions of the conventional circuitry and those of the sense amplifier precharge circuit SPD.

FIG. 5 shows how data is read out of the memory cell $MS_1$ by way of example. In this case, the control signal RASB is in a high level, so that the control signals $PDLB_0$ and $PDLB_1$ are in a low level. In this condition, the voltage converter 3 delivers the precharge drive signal $PDLD_0$ higher than $Vcc+V_{t1}$ to the precharge drive circuit $5_0$. The precharge drive circuit $5_0$ therefore feeds the precharge signal $PLD_0$ equal to Vcc to the sense amplifier precharge circuits SPD and precharge circuits $SW_1$ through $SW_n$. Likewise, the voltage converter 3' delivers the precharge drive signal $PDLD_1$ higher than $Vcc+V_{t1}$ to the precharge drive circuit $5_1$. The precharge drive circuit $5_1$ therefore feeds the precharge signal $PLD_1$ equal to Vcc to the sense amplifier precharge circuits SPD, I/O line precharge circuits IP, and precharge circuits $SWB_1$ through $SWB_n$.

Each I/O line amplifier precharge circuit SPD therefore precharges the I/O lines IOT and ION. At the same time, the precharge circuits $SW_1$ through $SW_n$ precharge the bit lines of the associated bit line pairs $BL_1$ through $BL_n$. Further, the precharge circuits $SWB_1$ through $SWB_n$ precharge the bit lines of the associated bit line pairs $BLB_1$ through $BLB_n$.

When a preselected RAS address designating the memory cell $MS_1$ is input at a time $t_1$, a row address decoder, not shown, outputs an internal address signal ADR. At the same time, the control signal RASB input from the outside goes low. At a time $t_2$, in response to the control signal RASB, the sense amplifier selector 1 delivers high-level control signals $PDLB_0$ and $PDLB_1$ to the precharge drive circuits $5_0$ and $5_1$, respectively, assigned to the sense amplifier row that corresponds to the address decoder. As a result, the precharge signals $PDL_0$ and $PDL_1$ start going low. This is the end of the operation for precharging the I/O lines IOT and ION and the bit lines of the bit line pairs $BL_1$ through $BL_n$. At the same time, the supply of the boosted voltage VBOOT to the voltage converter 3 ends.

Consequently, the MOS transistors $MN_{40}$ and $MN_{41}$ intervening between the I/O lines IOT and ION are turned off, causing the I/O line precharge circuits IP to stop equalizing the I/O lines IOT and ION.

Likewise, the MOS transistors included in the precharge circuits $SW_1$ through $SW_n$ for equalizing the complementary bit lines of the bit line pairs $BL_1$ through $BL_n$ turn off. For example, the MOS transistor $NM_3$ for equalizing the bit lines $BLT_1$ and $BLN_1$ of the bit line pair $BL_1$ turns off. In addition, the MOS transistors $NM_4$ and $NM_5$ for feeding the precharge current turn off. The bit lines of the bit line pairs $BL_1$ and $BL_n$ are therefore open, i.e., they are not electrically connected to any portion of the circuitry.

At this instant, the bit lines of the bit line pairs $BL_1$ through $BL_n$ are charged to, e.g., the voltage HFVC (Vcc/2).

At a time $t_4$, the I/O line precharge circuit IP stop precharging the I/O lines IOT and ION because the charge signals $PDL_0$ and $PDL_1$ have gone low at the time $t_2$. The I/O lines IOT and ION are not electrically connected to any portion of the circuitry, but are open (high impedance condition). At this instant, the I/O lines IOT and ION are charged to, e.g., the precharge voltage HFVC (Vcc/2). At a time $t_5$, the control signal RAE goes high with the result that the subword decoder SWD, FIG. 5, causes the word line $SWL_0$ to go high and thereby activates it.

At a time $t_6$, the MOS transistor $MN_{50}$ of the memory cell $MS_1$ turns on due to the activation of the word line $SWL_0$. As a result, a charge stored in the capacitor C and representative of data starts migrating toward the bit line $BLT_1$. The voltage on the bit line $BLT_1$ is raised from the voltage HFVC by a voltage corresponding to the charge transferred from the capacitor C. On the other than, the bit line $BLN_1$ remains at the same voltage because the word line $SWL_1$ is in a low level, i.e., because a charge is not transferred from the memory cell $MS_2$ connected to the bit line $BLN_1$.

More specifically, assume that high-level data is stored in the memory cell $MS_1$. Then, the charge stored in the capacitor C of the memory cell $MS_1$ is fed to the bit line $BLT_1$ and raises the voltage on the bit line $BLT_1$ above the precharge voltage Vcc/2. On the other hand, the bit line or dummy line $BLN_1$ remains at the precharge voltage Vcc/2.

At a time $t_8$, the circuit, not shown, causes the control signal TGO to go high in order to select the upper bit lines $BLT_1$ through $BLT_n$, to which the memory cells $MS_1$ through $MS_m$ are connected, in accordance with the address signal. At this instant, the MOS transistors MT and MN turn on. Consequently, the bit lines $BLT_1$ and $BLN_1$ are connected to the sense amplifier $SAP_1$. At this stage of operation, the sense amplifiers $SAP_1$ through $SAP_n$ have already been activated.

In the above condition, the MOS transistors MT and MN turn on. Therefore, the bit lines $BLT_2$ through $BLT_n$ and bit lines $BLN_2$ through $BLN_n$ are respectively connected to the sense amplifiers $SAP_2$ through $SAP_n$. Consequently, as the voltages on the power supply lines SAP and SAN approach the voltage Vcc and ground voltage, respectively, the voltage difference between the bit lines $BLT_1$ and $BLN_1$ is sequentially amplified.

The sense amplifier $SAP_1$ delivers the amplified voltage difference between the bit lines $BLT_1$ and $BLN_1$ to the output driver, not shown, in the form of high-level data via the column switch and data amplifier, not shown, in accordance with a column address fed from the outside.

At a time $t_9$, the control signal CASB indicative of the input timing of a column address signal goes low. In this case, a column address signal designating the memory cell $MS_1$ is input to the column decoder not shown. Subsequently, at a time $t_{10}$, the column decoder causes the control signal $CSL_1$ to go high on the basis of the column address signal designating the memory cell $MS_1$. As a result, the MOS transistors $MIT_1$ and $MIN_1$ turn on and cause the voltages on the bit lines $BLT_1$ and $BLN_1$ to be output to the I/O lines IOT and ION, respectively. Assuming that high-level data is stored in the memory cell $MS_1$, then the data is output to the output driver via the column switch and data amplifier in accordance with the column address.

At a time $t_{11}$, the control signal CASB goes high. Then, at a time $T_{12}$, the column decoder causes the control signal $CSL_1$ to go low.

Subsequently, at a time $t_{14}$, the control signal $CSL_1$ fully reaches a low level and turns off the MOS transistors $MIT_1$ and $MIN_1$. Consequently, the bit lines $BLT_1$ and $BLN_1$ are disconnected from the I/O lines IOT and ION. Thereafter, the control signal PI goes high. Consequently, the MOS transistor $MN_{46}$ turns on and short-circuits, or equalizes, the I/O lines IOT and ION. Assume that only the column address is varied with the row address being fixed so as to read data out of, e.g., the memory cells $MS_1$, $MS_3$, ..., $MS_{m-1}$ and $MS_m$ in this order, and that quasi-precharging is executed for the I/O lines IOT and ION. Then, the control signal PI is input in a high level.

At a time $t_{16}$, the I/O lines IOT and ION are equilibrated substantially at the voltage Vcc/2 as a result of the above equalization. This is equivalent to the precharged condition. At a time $t_{17}$, the control circuit PIO goes low and makes the I/O lines IOT and ION open (Hi-Z: high impedance state).

At a time $t_{19}$, the sense amplifier selector 1 causes the precharge control signals $PDLB_0$ and $PDLB_1$ to go low in accordance with the control signal RASB because of the low level set up at the time $t_{12}$. In response, the voltage converter 3 raises the precharge drive signal $PDLD_0$ from a low level. Likewise, the voltage converter 3' raises the precharge drive signal $PDLD_1$ from a low level. The precharge circuits $5_0$ and $5_1$ respectively cause the precharge signals $PDL_0$ and $PDL_1$ to go high.

At a time $t_{21}$, the I/O line precharge circuits IP start precharging the I/O lines IOT and ION. The I/O line precharge circuit IP precharges the I/O lines IOT and ION to the voltage HFVC (Vcc/2) and then ends the precharging operation.

In the illustrative embodiment, the I/O line precharge circuit IP replaces the conventional AND gate $M_2$ including p-channel MOS transistors with the n-channel MOS transistors $MN_{42}$ through $MN_{45}$ that implement more rapid charge migration than p-channel MOS transistors. In addition, the precharge drive signals $PDLD_0$ and $PDLD_1$ have a high level equal to the boosted voltage VBOOT that is higher than $Vcc+V_{t1}$.

With the above configuration, the illustrative embodiment allows the precharge signals $PDL_0$ and $PDL_1$ to rapidly go high and therefore promotes rapid transition of the MOS transistors $MN_{40}$ through $MN_{45}$. Further, the MOS transistors $MN_{40}$ through $MN_{45}$ can have a broader channel width than p-channel transistors and can therefore have their conductance increased. It follows that the I/O line precharging time beginning at the time $t_{21}$ can be reduced without increasing the area of the crossing region at all, compared to the conventional semiconductor memory. That is, the illustrative embodiment promotes rapid access without increasing the chip area of the semiconductor memory. In this case, because p-channel MOS transistors are absent in the I/O line precharge circuit SPD, it is not necessary to form n-wells. This allows the other n-channel MOS transistors adapted for drive to have their channel width increased and thereby promotes rapid operation of the sense amplifier precharge circuit SPP and that of the precharge drive circuits $5_0$ and $5_1$. Consequently, a semiconductor memory with a short access time is achievable.

In the precharge drive circuit $5_0$ ($5_1$), the MOS transistors $NM_2$ may be provided with a broader channel with than the MOS transistor $NM_1$. In such a configuration, even if a penetrating current is caused to flow between the MOS transistors $NM_1$ and $NM_2$ at the end of precharging of the bit lines, the transistor $MN_2$ is capable of causing the current of the transistor $MN_1$ to sufficiently flow to ground. This allows the recharge signal to rapidly vary from a high level to a low level.

Moreover, in the illustrative embodiment, the high-level voltage of the precharge signals $PDL_0$ and $PDL_1$ may be made higher than the voltage Vcc. This successfully enhances the ON-state conductance of the MOS transistors $MN_4$ through $MN_{45}$ constituting the sense amplifier precharge circuit SPD and the ON-state conductance of the MOS transistors $NM_3$ through $NM_5$ constituting the precharge circuits $SW_1$ through $SW_n$. In this case, the boosted voltage $Vcc_2$ higher than the voltage Vcc (potential of n-wells where the sense amplifiers $SA_1$ through $SA_n$ are formed) is applied to the drain of the MOS transistor $NM_1$ included in each of the precharge drive circuits $5_0$ and $5_1$. Assume that the threshold voltage of the MOS transistors $MN_{40}$ through $MN_{45}$ and MOS transistors $NM_3$ through $NM_5$ is $Vt_2$. Then, the precharge drive signals $PDLD_0$ and $PDLD_1$ should preferably have a voltage higher than $Vcc_2 + V_{t1} + V_{t2}$.

In the above configuration, the boosting circuit, not shown, applies the boosted voltage VBOOT higher than the voltage $Vcc_2 + V_{t1} + V_{t2}$ to the voltage converter 3. Again, the boosted voltage $Vcc_2$ is generated by a power supply different from the power supply that generates the boosted voltage VBOOT. This kind of scheme is successful to efficiently apply the voltage $Vcc_2$ to the gates of the MOS transistors $MN_{40}$ through $MN_{45}$ and those of the MOS transistors $NM_3$ through $NM_5$. Consequently, there can be improved the ON-state conductance of the MOS transistors $MN_{40}$ through $MN_{45}$ constituting the sense amplifier precharge circuit SPD and the MOS transistors $NM_3$ through $NM_5$ constituting the precharge drive circuits $SW_1$ through $SW_n$.

The I/O line precharge circuit SPD therefore allows more charge current to flow for the I/O lines IOT and ION than the conventional I/O line precharge circuit, thereby saving the precharging time allocated to the I/O lines IOT and ION. Further, because the conductance of the MOS transistors $MN_{40}$ and $MN_{41}$ decreases, the I/O line precharge circuit SPD allows the voltages of the I/O lines IOT and ION to be closer to each other as a result of equalization. It is noteworthy that because the MOS transistor $NM_1$ included in each of the precharge drive circuits $5_0$ and $5_1$ is not a p-channel MOS transistor, a boosted voltage higher than the voltage Vcc (potentials of n-wells where the sense amplifiers $SA_1$ through $SA_n$ are formed) can be applied to the drain of the transistor $NM_1$.

Figure 15:
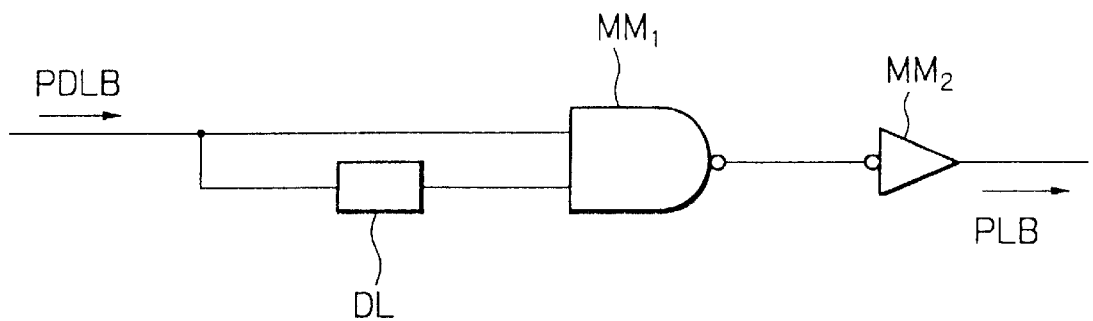
FIG. 15 is a schematic block diagram showing a specific configuration of a delay circuit representative of another alternative embodiment of the present invention.

FIG. 15 shows another alternative embodiment of the present invention, particularly a delay circuit included therein for delaying only the rising time. In the previous embodiments, after the precharge drive signal $PDLD_0$ ($PDLD_1$) has gone low to turn off the MOS transistor $NM_1$ of the precharge drive circuit $5_0$ ($5_1$), the precharge control signal $PDLB_0$ ($PDLB_1$) goes low in order to cause the precharge signal $PDL_0$ ($PDL_1$) to go low. The delay circuit shown in FIG. 15 is used to adjust the transition time of the precharge control signal $PDLB_0$ ($BDLB_1$) to a high level. For this purpose, in FIGS. 9 and 10, the delay circuit is connected between the output terminal of the sense amplifier selector 1 and the gate of the MOS transistor $NM_2$ included in the precharge drive circuit $5_0$ and between the sense amplifier selector 1 and the gate of the MOS transistor $NM_2$ included in the precharge drive circuit $5_1$.

As shown, the delay circuit includes a delay device DL including, e.g., a resistor and a capacitor. The delay device DL is provided with a preselected delay time equal to an interval between the rise of the precharge control signal $PDLB_0$ ($PDLB_1$) and the turn-off of the MOS transistor $NM_1$. A NAND gate $MM_1$ produces a NAND of the precharge control signal $PDLB_0$ ($PDLB_1$) and a delayed signal output from the delay device DL. An inverter $MM_2$ inverts the output of the NAND gate $MM_1$ and inputs the resulting signal to the MOS transistor $NM_2$ as a precharge stop signal $PLB_0$ ($PLB_1$). In this manner, the delay device DL delays the transition time from a low level to a high level without by the preselected delay time, but does not delay the transition time from a high level to a low level.

With the above configuration, the alternative embodiment can adjust the transition time of the precharge control signal $PDLB_0$ ($PDLB_1$) to a high level in matching relation to the turn-off of the MOS transistor $NM_1$. This successfully prevents a penetrating current from flowing between the MOS transistors $NM_1$ and $NM_2$ included in each of the precharge drive circuits $5_0$ and $5_1$. Of course, this alternative embodiment additionally achieves the same advantages as the previous embodiments. In summary, it will be seen that the present invention provides a semiconductor memory capable of rapidly starting precharging a power supply line and a ground line without increasing an area to be allocated sense amplifier precharge circuitry, and therefore promoting rapid access without increasing the chip size of an integrated circuit.

Various modifications will become possible for those skilled in the art after receiving the teachings of the present invention.

What is claimed is:

1. A semiconductor memory comprising:
   a plurality of memory cell regions each being constituted by a particular memory cell;
   a plurality of word lines for selecting memory cells;
   a word line drive circuit for activating, based on an address signal input from outside said semiconductor memory, one of said plurality of word lines to which a memory cell designated by said address signal is connected;
   a bit line connected to the memory cell selected by the word line activated for reading data out of said memory cell in a form of a voltage change;
   a sense amplifier for amplifying a potential difference between two adjoining bit lines forming a bit line pair to thereby output two data voltages respectively corresponding to said two bit lines;
   a sense amplifier precharge circuit for charging, before said sense amplifier starts amplifying the potential difference, a power supply line and a ground line, which feed a voltage to said sense amplifier, to a preselected voltage; and
   a drive circuit for feeding to a gate of a first n-channel MOS transistor and a gate of a second n-channel MOS transistor included in said sense amplifier precharge circuit a control signal of a preselected high-level voltage from a third n-channel MOS transistor, wherein said first and second n-channel MOS transistors feed a precharge current output from a precharge power supply to said power supply line and said ground line, respectively.

2. A semiconductor memory as claimed in claim 1, wherein an ON signal input to a gate of said third MOS transistor for turning on said third MOS transistor has a voltage higher than a sum of the voltage of the control signal and a threshold voltage of said third MOS transistor.

3. A semiconductor memory as claimed in claim 2, further comprising:
   a fourth n-channel MOS transistor connected between said power supply line and said precharge power supply in series with said first MOS transistor; and
   a fifth n-channel MOS transistor connected between said ground line and said precharge power supply in series with said second MOS transistor;
   wherein when all of said first, fourth, second and fifth MOS transistors are turned on, said power supply line and said ground line are precharged.

4. A semiconductor memory as claimed in claim 3, further comprising a sixth and a seventh n-channel MOS transistor serially connected between said power supply line and said ground line for equalizing voltages on said power supply line and said ground line.

5. A semiconductor memory as claimed in claim 1, further comprising:
   a fourth n-channel MOS transistor connected between said power supply line and said precharge power supply in series with said first MOS transistor; and
   a fifth n-channel MOS transistor connected between said ground line and said precharge power supply in series with said second MOS transistor;
   wherein when all of said first, fourth, second and fifth MOS transistors are turned on, said power supply line and said ground line are precharged.

6. A semiconductor memory as claimed in claim 5, further comprising a sixth and a seventh n-channel MOS transistor serially connected between said power supply line and said ground line for equalizing voltages on said power supply line and said ground line.

7. A semiconductor memory as claimed in claim 1, further comprising a sixth and a seventh n-channel MOS transistor serially connected between said power supply line and said ground line for equalizing voltages on said power supply line and said ground line.

8. A semiconductor memory comprising:
   a plurality of memory cell regions each being constituted by a particular memory cell;
   a plurality of word lines for selecting memory cells;
   a word line drive circuit for activating, based on an address signal input from an outside of said semiconductor memory, one of said plurality of word lines to which a memory cell designated by said address signal is connected;
   a bit line connected to the memory cell selected by the word line activated for reading data out of said memory cell in a form of a voltage change;

a sense amplifier for amplifying a potential difference between two adjoining bit lines forming a bit line pair to thereby output first data voltage and second data voltage respectively corresponding to said two bit lines;

a first I/O line for delivering the first data voltage output from said sense amplifier;

a second I/O line for delivering the second data voltage output from said sense amplifier;

an I/O line precharge circuit for charging, before said sense amplifier outputs the first and second data voltages, potentials on said first and second I/O lines to a preselected voltage; and a drive circuit for feeding to a gate of a first n-channel MOS transistor and a gate of a second n-channel MOS transistor included in said I/O line precharge circuit a control signal of a preselected high-level voltage from a third n-channel MOS transistor, wherein said first and second n-channel MOS transistors feed a precharge current output from a precharge power supply to said first and second I/O lines, respectively.

9. A semiconductor memory as claimed in claim 8, wherein an ON signal input to a gate of said third MOS transistor for turning on said third MOS transistor has a voltage higher than a sum of the voltage of the control signal and a threshold voltage of said third MOS transistor.

10. A semiconductor memory as claimed in claim 8, further comprising:

a fourth n-channel MOS transistor connected between said first I/O line and said precharge power supply in series with said first MOS transistor; and a fifth n-channel MOS transistor connected between said second I/O line and said precharge power supply in series with said second MOS transistor;

wherein when all of said first, fourth, second and fifth MOS transistors are turned on, said first and second I/O lines are precharged.

11. A semiconductor memory as claimed in claim 8, further comprising a sixth and a seventh n-channel MOS transistor serially connected between said first and second I/O lines for equalizing voltages on said first and second I/O lines.

12. A semiconductor memory as claimed in claim 8, further comprising a voltage converter for outputting a voltage defining a high level of a charge signal, which is input from an internal logical circuit for turning on said third MOS transistor, as the ON signal.

13. A semiconductor memory as claimed in claim 8, wherein said sense amplifier and said word line drive circuit intersect each other at a crossing region where said sense amplifier, said word line drive circuit and said memory cells are absent, and wherein said first, second, third, fourth, fifth, sixth and seventh MOS transistors are formed in said crossing region.

14. A semiconductor memory comprising:

a plurality of memory cell regions each being constituted by a particular memory cell;

a plurality of word lines for selecting memory cells;

a word line drive circuit for activating, based on an address signal input from an outside of said semiconductor memory, one of said plurality of word lines to which a memory cell designated by said address signal is connected;

a bit line connected to the memory cell selected by the word line activated for reading data out of said memory cell in a form of a voltage change;

a sense amplifier for amplifying a potential difference between two adjoining bit lines forming a bit line pair to thereby output first data voltage and second data voltage respectively corresponding to said two bit lines;

a first I/O line for delivering the first data voltage output from said sense amplifier;

a second I/O line for delivering the second data voltage output from said sense amplifier;

a sense amplifier precharge circuit for charging, before said sense amplifier starts amplifying the potential difference, a power supply line and a ground line, which feed a voltage to said sense amplifier, to a preselected voltage;

an I/O line precharge circuit for charging, before said sense amplifier outputs the first and second data voltages, potentials on said first and second I/O lines to a preselected voltage; and a drive circuit for feeding to a gate of a first n-channel MOS transistor and a gate of a second n-channel MOS transistor included in said sense amplifier precharge circuit and a gate of a third n-channel MOS transistor and a gate of a fourth n-channel MOS transistor included in said I/O line precharge circuit a control signal of a preselected high-level voltage from a fifth n-channel MOS transistor, wherein said first and second n-channel MOS transistors feed a precharge current output from a precharge power supply to said power supply line and said ground line, respectively, and wherein said third and fourth n-channel MOS transistors feed said precharge current to said first and second I/O lines, respectively.

15. A semiconductor memory as claimed in claim 14, wherein an ON signal input to a gate said fifth MOS transistor for turning on said first, second, third and fourth MOS transistors has a voltage higher than a sum of the voltage of the control signal and a threshold voltage of said fifth MOS transistor.

16. A semiconductor memory as claimed in claim 15, further comprising:

a sixth n-channel MOS transistor connected between said power supply line and said precharge power supply in series with said first MOS transistor; and a seventh n-channel MOS transistor connected between said ground line and said precharge power supply in series with said second MOS transistor;

an eighth n-channel MOS transistor connected between said first I/O line and said precharge power supply in series with said third MOS transistor; and a ninth n-channel MOS transistor connected between said second I/O line and said precharge power supply in series with said fourth MOS transistor;

wherein when all of said first, sixth, second and seventh MOS transistors are turned on, said power supply mine and said ground line are precharged, and wherein when all of said third, eighth, fourth and ninth MOS transistors are turned on, said first and second I/O lines are precharged.

17. A semiconductor memory as claimed in claim 16, further comprising:

a tenth and an eleventh n-channel MOS transistor serially connected between said power supply line and said ground line for equalizing voltages on said power supply line and said ground line; and a twelfth and a thirteenth n-channel MOS transistor serially connected between said first and second I/O lines for equalizing voltages on said first and second I/O lines.

18. A semiconductor memory as claimed in claim 17, further comprising a voltage converter for outputting a voltage defining a high level of a charge signal, which is input from a internal logical circuit for turning on said fifth MOS transistor, as the ON signal.

19. A semiconductor memory as claimed in claim 18, wherein said sense amplifier and said word line drive circuit intersect each other at a crossing region where said sense ampifier, said word line drive circuit and said memory cells are absent, and wherein said first, second, third, fourth, fifth, sixth, seventh, eighth, ninth, tenth, eleventh, twelfth and thirteenth MOS transistors are formed in said crossing region.

20. A semiconductor memory as claimed in claim 14, further comprising:

a sixth n-channel MOS transistor connected between said power supply line and said precharge power source in series with said first MOS transistor; and a seventh n-channel MOS transistor connected between said ground line and said precharge power supply in series with said second MOS transistor;

an eighth n-channel MOS transistor connected between said first I/O line and said precharge power supply in series with said third MOS transistor; and a ninth n-channel MOS transistor connected between said second I/O line and said precharge power supply in series with said fourth MOS transistor;

wherein when all of said first, sixth, second and seventh MOS transistors are turned on, said power supply line and said ground line are precharged, and wherein when all of said third, eighth, fourth and ninth MOS transistors are turned on, said first and second I/O lines are precharged.

21. A semiconductor memory as claimed in claim 20, further comprising:

a tenth and an eleventh n-channel MOS transistor serially connected between said power supply line and said ground line for equalizing voltages on said power supply line and said ground line; and a twelfth and a thirteenth n-channel MOS transistor serially connected between said first and second I/O lines for equalizing voltages on said first and second I/O lines.

22. A semiconductor memory as claimed in claim 21, wherein said sense amplifier and said word line drive circuit intersect each other at a crossing region where said sense amplifier, said word line drive circuit and said memory cells are absent, and wherein said first, second, third, fourth, fifth, sixth, seventh, eighth, ninth, tenth, eleventh, twelfth and thirteenth MOS transistors are formed in said crossing region.

23. A semiconductor memory as claimed in claim 14, further comprising a voltage converter for outputting a voltage defining a high level of a charge signal, which is input from a internal logical circuit for turning on said fifth MOS transistor, as the ON signal.

* * * * *

UNITED STATES PATENT AND TRADEMARK OFFICE
CERTIFICATE OF CORRECTION

PATENT NO. : 6,201,749 B1
DATED : March 13, 2001
INVENTOR(S) : M. Fujita

Page 1 of 1

It is certified that error appears in the above-identified patent and that said Letters Patent is hereby corrected as shown below:

Column 12,
Line 30, "SAP," should read -- $SAP_1$ --
Line 31, "MIT," should read -- $MIT_1$ --

Column 13,
Line 39, "$T_{10}$" should read -- T11 --

Column 15,
Line 2, "$RAI_0$is" should read -- $RAI_0$ is --
Line 4, "$RAI_3$are" should read -- $RAI_3$ are --

Column 17,
Line 38, "SAP," should read -- $SAP_1$ --

Column 26,
Line 53, "supply mine" should read --supply line --

Signed and Sealed this

Eleventh Day of December, 2001

*Attest:*

NICHOLAS P. GODICI
*Attesting Officer*     *Acting Director of the United States Patent and Trademark Office*